US011929400B2

(12) United States Patent
Ohse et al.

(10) Patent No.: US 11,929,400 B2
(45) Date of Patent: Mar. 12, 2024

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Naoyuki Ohse, Matsumoto (JP); Takahito Kojima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 446 days.

(21) Appl. No.: 17/360,980

(22) Filed: Jun. 28, 2021

(65) Prior Publication Data
US 2021/0328025 A1 Oct. 21, 2021

Related U.S. Application Data

(63) Continuation of application No. PCT/JP2020/020807, filed on May 26, 2020.

(30) Foreign Application Priority Data

Jul. 29, 2019 (JP) .................................. 2019-139221

(51) Int. Cl.
*H01L 29/66* (2006.01)
*H01L 21/28* (2006.01)
(Continued)

(52) U.S. Cl.
CPC .......... *H01L 29/1608* (2013.01); *H01L 21/28* (2013.01); *H01L 29/66143* (2013.01); *H01L 29/872* (2013.01)

(58) Field of Classification Search
CPC ........... H01L 29/1608; H01L 29/66143; H01L 29/872
(Continued)

(56) References Cited

U.S. PATENT DOCUMENTS

2003/0006415 A1* 1/2003 Yokogawa ............ H01L 29/812
257/532
2008/0277668 A1 11/2008 Okuno et al.
(Continued)

FOREIGN PATENT DOCUMENTS

JP  H0786621 A   3/1995
JP  2000-261004 A   9/2000
(Continued)

OTHER PUBLICATIONS

International Search Report for PCT/JP2020/020807, dated Jul. 28, 2020.
(Continued)

*Primary Examiner* — Monica D Harrison
(74) *Attorney, Agent, or Firm* — Rabin & Berdo, P.C.

(57) ABSTRACT

A method of manufacturing a silicon carbide semiconductor device, including forming a first-conductivity-type region in a SiC semiconductor substrate, selectively forming a plurality of second-conductivity-type regions in the first-conductivity-type region, forming an interlayer insulating film covering the first-conductivity-type region and the second-conductivity-type regions, selectively removing the interlayer insulating film to form a plurality of openings exposing the second-conductivity-type regions, forming, in each opening, a layered metal film having a cap film stacked on an aluminum film, thermally diffusing aluminum atoms in the aluminum film to thereby form a plurality of second-conductivity-type high-concentration regions, removing the layered metal film, selectively removing the interlayer insulating film to form a contact hole, forming a first electrode by sequentially stacking a titanium film and a metal film containing aluminum on the first surface of the semiconductor substrate in the contact hole, and forming a second (Continued)

electrode on the second main surface of the semiconductor substrate.

13 Claims, 20 Drawing Sheets

(51) Int. Cl.
  *H01L 29/16* (2006.01)
  *H01L 29/872* (2006.01)
(58) Field of Classification Search
  USPC .......................................................... 257/77
  See application file for complete search history.

(56) References Cited

U.S. PATENT DOCUMENTS

| | | | |
|---|---|---|---|
| 2010/0032730 | A1 | 2/2010 | Endo et al. |
| 2010/0055858 | A1 | 3/2010 | Hayashi et al. |
| 2015/0333190 | A1 | 11/2015 | Aketa et al. |
| 2016/0315169 | A1 | 10/2016 | Yoshikawa et al. |
| 2016/0315203 | A1 | 10/2016 | Uchida et al. |
| 2018/0061951 | A1 | 3/2018 | Kitamura |
| 2019/0228971 | A1 | 7/2019 | Iguchi et al. |

FOREIGN PATENT DOCUMENTS

| | | |
|---|---|---|
| JP | 2005-276978 A | 10/2005 |
| JP | 2006186040 A | 7/2006 |
| JP | 2008-282972 A | 11/2008 |
| JP | 4291875 B2 | 7/2009 |
| JP | 2010-062513 A | 3/2010 |
| JP | 2014-116471 A | 6/2014 |
| JP | 6546759 B2 | 7/2014 |
| JP | 6013817 B2 | 10/2016 |
| JP | 2016-207881 A | 12/2016 |
| JP | 2016-208030 A | 12/2016 |
| JP | 2018-032794 A | 3/2018 |
| JP | 2019-125761 A | 7/2019 |

OTHER PUBLICATIONS

N. Kiritani, et al., "Single Material Ohmic Contacts Simultaneously Formed on the Source/P-well/Gate of 4H—SiC Vertical MOSFETs", Materials Science Forum, Switzerland, Trans Tech Publications, 2003, vol. 433-vol. 436, pp. 669-672.
Written Opinion of the International Searching Authority for PCT/JP2020/020807, dated Jul. 28, 2020.
Office Action of Japanese Patent Application No. 2021-536629 dated Aug. 9, 2022.
Extended European Search Report in the counterpart European application No. 20846285.3 dated Jul. 1, 2022.

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This is a continuation application of International Application PCT/JP2020/020807 filed on May 26, 2020 which claims priority from a Japanese Patent Application No. 2019-139221 filed on Jul. 29, 2019, the contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Recently, silicon carbide (SiC) semiconductors have gained attention as a semiconductor material that enables fabrication (manufacture) of semiconductor devices (hereinafter, silicon carbide semiconductor devices) that exceed the limitations of semiconductor devices that use a silicon (Si) semiconductor. In particular, as compared to a silicon semiconductor, a silicon carbide semiconductor has high dielectric breakdown field strength and high thermal conductivity; and due to such characteristics, application to high-voltage (for example, at least 1700V) semiconductor devices is expected.

When a silicon carbide semiconductor device is a diode (hereinafter, silicon carbide diode), it is possible to set a thin thickness and high impurity concentration as design specifications for an n⁻-type epitaxial layer that forms an n⁻-type drift region and therefore, a silicon carbide diode having a breakdown voltage up to about 3300V typically has a Schottky barrier diode (SBD) structure.

A structure of a conventional silicon carbide diode having an SBD structure is described. FIG. 31 is a plan view depicting a state of the conventional silicon carbide semiconductor device when viewed from a front side of a semiconductor substrate thereof. A conventional silicon carbide semiconductor device 140 depicted in FIG. 31 is a silicon carbide diode having an SBD structure in which, in an active region 110, in an entire area of a front surface of a semiconductor substrate 130 containing silicon carbide, a Schottky junction is formed along a front surface of the semiconductor substrate 130.

The Schottky junction of the conventional silicon carbide semiconductor device 140 is formed by an n⁻-type drift region 112 exposed at the front surface of a semiconductor substrate 130 and a front electrode (not depicted) configured by a metal layer provided on the front surface of the semiconductor substrate 130. Reference numerals 120, 121 are an edge termination region and a field limiting ring (FLR), respectively.

Usually, in an SBD structure, electric field strength at bonded surfaces between the semiconductor substrate 130 and the front electrode is high and when reverse voltage is applied, a problem arises in that reverse leak current increases due to the tunneling of electrons in the Schottky barrier or reverse leak current increases due to surface characteristics particular to silicon carbide. Therefore, a silicon carbide diode has been proposed that adopts a junction barrier Schottky (JBS) structure that has both Schottky junctions and pn junctions at a front side of the semiconductor substrate 130.

A structure of a conventional silicon carbide diode having a JBS structure will be described. FIG. 32 is a plan view of another example of a conventional silicon carbide semiconductor device, as viewed from a front side of a semiconductor substrate. The conventional silicon carbide semiconductor device 140' depicted in FIG. 32 differs from the conventional silicon carbide semiconductor device 140 depicted in FIG. 31 in that in the active region 110, on the front side of the semiconductor substrate 130, a SBD structure formed by Schottky junctions between the n⁻-type drift region 112 and the front electrode (not depicted), and a JBS structure formed by pn junctions between p-type regions 113 and the n⁻-type drift region 112, are both present.

The p-type regions 113 are selectively provided in surface regions of the semiconductor substrate 130 at the front surface thereof in the active region 11. Between adjacent p-type regions 113 of the p-type regions 113, the n⁻-type drift region 112 is exposed at the front surface of the semiconductor substrate 130. At the front surface of the semiconductor substrate 130, pn junctions between the p-type regions 113 and the n⁻-type drift region 112 are formed. Portions of the n⁻-type drift region 112 between the adjacent p-type regions 113 form Schottky junctions with the front electrode provided on the front surface of the semiconductor substrate 130.

In this manner, the JBS structure has a mixture of Schottky junctions and pn junctions at the bonded surfaces between the semiconductor substrate 130 and the front electrode, whereby the electric field strength at the bonded surfaces between the semiconductor substrate 130 and the front electrode may be reduced and therefore, reverse leak current equivalent to that of a freewheeling diode (FWD) containing silicon semiconductor may be suppressed. In FIG. 32, the p-type regions 113 having a striped pattern extending in a direction parallel to the front surface of the semiconductor substrate 130 are indicated by hatching.

Further, in the conventional silicon carbide semiconductor device 140 depicted in FIG. 31, surge current that flows in a forward direction during application of surge voltage has a small current amount that is pulled out to the front electrode from inside the semiconductor substrate 130 (hereinafter, pulled amount). A reason for this is that the diode of the SBD structure is a unipolar device that does not use minority carriers for electrical conduction and in a high-current region of the diode where high forward current passes, a contact (electrical contact) between the semiconductor substrate and the front electrode has high resistance.

When the contact between the semiconductor substrate 130 and the front electrode has high resistance and high surge current flows in the forward direction in the semiconductor substrate, the surge current concentrates locally due to heat generated at an interface between the semiconductor substrate 130 and the front electrode. Due to this concentration of surge current, destruction occurs at the Schottky junction surface and the n⁻-type epitaxial layer (the n⁻-type drift region 112) directly beneath the Schottky junctions and therefore, the pulled amount of the surge current pulled from inside the semiconductor substrate 130 to the front electrode decreases.

The pulled amount of the surge current has been confirmed to increase in a diode having a JBS structure that uses a silicon semiconductor. Therefore, in the conventional silicon carbide semiconductor device 140' depicted in FIG. 32 as well, similarly to a diode having a JBS structure that uses a silicon semiconductor, the pulled amount of the surge current was expected to be large due to the rising phenomenon of the surge current as a consequence of bipolar operation of pn junctions formed at the front surface of the semiconductor substrate 130 by the p-type regions 113 and the n⁻-type drift region 112, however, this effect did not noticeably appear.

As one factor for the pulled amount of the surge current of the conventional silicon carbide semiconductor device 140' depicted in FIG. 32 being small, it is conceivable that the resistance of the ohmic contact between the front electrode and the p-type regions 113 constituting pn junction parts of the JBS structures was not low enough. Thus, surge current capability is assumed to be enhanced by forming, between the p-type regions 113 and the front electrode, metal electrodes (hereinafter, ohmic electrodes) in ohmic contact with the p-type regions 113, and by locally passing surge current in the pn junction parts of the JBS structures.

As a method of manufacturing a conventional silicon carbide diode having a JBS structure, a method has been proposed according to which a metal electrode (hereinafter, Schottky electrode) that forms Schottky junctions with an n⁻-type drift region is formed only on parts of the n⁻-type drift region exposed at a front surface of a semiconductor substrate and thereafter, on the front surface of the semiconductor substrate, ohmic electrodes in ohmic contact with p-type regions constituting pn junction parts of the JBS structures are formed so as to cover the Schottky electrode (for example, refer to Japanese Patent No. 5546759).

Japanese Patent No. 5546759 discloses that aluminum (Al) or nickel (Ni) is used as a material of the ohmic electrodes, and molybdenum (Mo) is used as a material of the Schottky electrode. Further, Japanese Patent No. 5546759 discloses a silicon carbide diode in which in p-type regions constituting pn junction parts of the JBS structures, p⁺-type contact regions having an impurity concentration higher than that of the p-type regions are selectively formed, whereby an ohmic property between the p-type regions and ohmic electrodes is enhanced.

As another method of manufacturing a conventional silicon carbide diode having JBS structures, a method has been proposed according to which ohmic electrodes are formed only on p-type regions constituting pn junction parts of the JBS structure and thereafter, on a front surface of a semiconductor substrate, a Schottky electrode that forms a Schottky junction with an n⁻-type drift region is formed so as to cover the ohmic electrodes (for example, refer to Japanese Laid-Open Patent Publication No. 2008-282972. Japanese Laid-Open Patent Publication No. 2008-282972 discloses that molybdenum (Mo) is used as a material of the Schottky electrode.

As a method of manufacturing ohmic electrodes on the p-type regions, a method has been proposed according to which on a semiconductor substrate containing silicon carbide, after an aluminum film and a nickel film are sequentially stacked so as to cover the p-type regions, silicon atoms in the semiconductor substrate and nickel atoms in the nickel film are caused to react by annealing (heat treatment) at 1000 degrees C., whereby a nickel silicide (NiSi) film that forms ohmic electrodes in ohmic contact with the p-type regions is formed (for example, refer to N. Kiritani, 7 others, "Single Material Ohmic Contacts Simultaneously Formed on the Source/P-well/Gate of 4H—SiC Vertical MOSFETs", Materials Science Forum, Switzerland, Trans Tech Publications, 2003, Vol. 433-Vol. 436, pp. 669-672).

As another method of forming ohmic electrodes on p-type regions, a method has been proposed according to which after a nickel film and an aluminum film are sequentially stacked on a silicon carbide semiconductor substrate so as to cover the p-type regions, the metal films and the semiconductor substrate are cause to react with one another by a heat treatment, thereby forming p-type ohmic electrodes containing an alloy of nickel, aluminum, silicon, and carbon (for example, refer to Japanese Patent No. 4291875). In Japanese Patent No. 4291875, a thickness of the nickel film is in a range from 50 nm to 150 nm and a thickness of the aluminum film is in a range from 10 nm to 50 nm.

As a method of forming ohmic electrodes of a fine pattern, a method has been proposed according to which after contact holes are formed in an interlayer insulating film, a nickel film is deposited in an entire area of a front surface of a semiconductor substrate by sputtering, etc., and after a nickel silicide is formed as the ohmic electrodes in areas of the nickel film in contact with the semiconductor substrate by a heat treatment, unreacted portions of the nickel film not reacted with the semiconductor substrate are removed by etching, whereby the ohmic electrodes are left in the contact holes by self-alignment (for example, refer to Japanese Laid-Open Patent Publication No. 2005-276978).

As a method of forming p-type regions in a semiconductor substrate containing silicon carbide, a method has been proposed according to which p-type regions are formed in an n⁻-type drift region by a laser doping technique of implanting aluminum contained in a gas atmosphere, the aluminum being implanted by laser irradiation into a semiconductor substrate in the gas atmosphere containing the aluminum (for example, refer to Japanese Laid-Open Patent Publication No. 2016-207881). Japanese Laid-Open Patent Publication No. 2016-207881 described that the p-type regions formed by the laser doping technique include an electric field mitigating region, the p-type regions, a FLR, and a channel stopper region configuring a JBS structure.

SUMMARY OF THE INVENTION

According to an embodiment of the invention, a method of manufacturing a silicon carbide semiconductor device, includes forming a first-conductivity-type region in a semiconductor substrate containing silicon carbide, a surface of the first-conductivity-type region constituting a first main surface of the semiconductor substrate, a second main surface of the semiconductor substrate being opposite to the first main surface thereof; selectively forming a plurality of second-conductivity-type regions in the first-conductivity-type region, at the first main surface of the semiconductor substrate; forming, on the first main surface of the semiconductor substrate, an interlayer insulating film covering the first-conductivity-type region and the second-conductivity-type regions; selectively removing the interlayer insulating film to form a plurality of openings exposing the second-conductivity-type regions; forming, in each of the openings of the interlayer insulating film, a layered metal film, to thereby have an aluminum film in contact with the first main surface of the semiconductor substrate and a cap film stacked on the aluminum film to cover the aluminum film; thermally diffusing aluminum atoms in the aluminum film, from a contact portion between the aluminum film and the semiconductor substrate, to the second-conductivity-type regions by a heat treatment, to thereby form a plurality of second-conductivity-type high-concentration regions, each second-conductivity-type high-concentration region being formed in a surface region of one of the second-conductivity-type regions, and having an impurity concentration higher than an impurity concentration of said one second-conductivity-type regions; removing the layered metal film after forming the second-conductivity-type high-concentration regions; selectively removing the interlayer insulating film to form a contact hole, after removing the layered metal film; forming a first electrode by sequentially stacking a titanium film and a metal film containing aluminum on the first surface of the semiconductor substrate in the contact hole, the titanium film being in contact with the first-conductivity-type region and forming Schottky junctions with the first-conductivity-type region, the titanium film being in contact with the second-conductivity-type high-concentration regions and forming ohmic contacts with the second-conductivity-type high-concentration regions; and forming a second electrode on the second main surface of the semiconductor substrate.

Objects, features, and advantages of the present invention are specifically set forth in or will become apparent from the following detailed description of the invention when read in conjunction with the accompanying drawings.

DETAILED DESCRIPTION OF THE INVENTION

Figure 32:
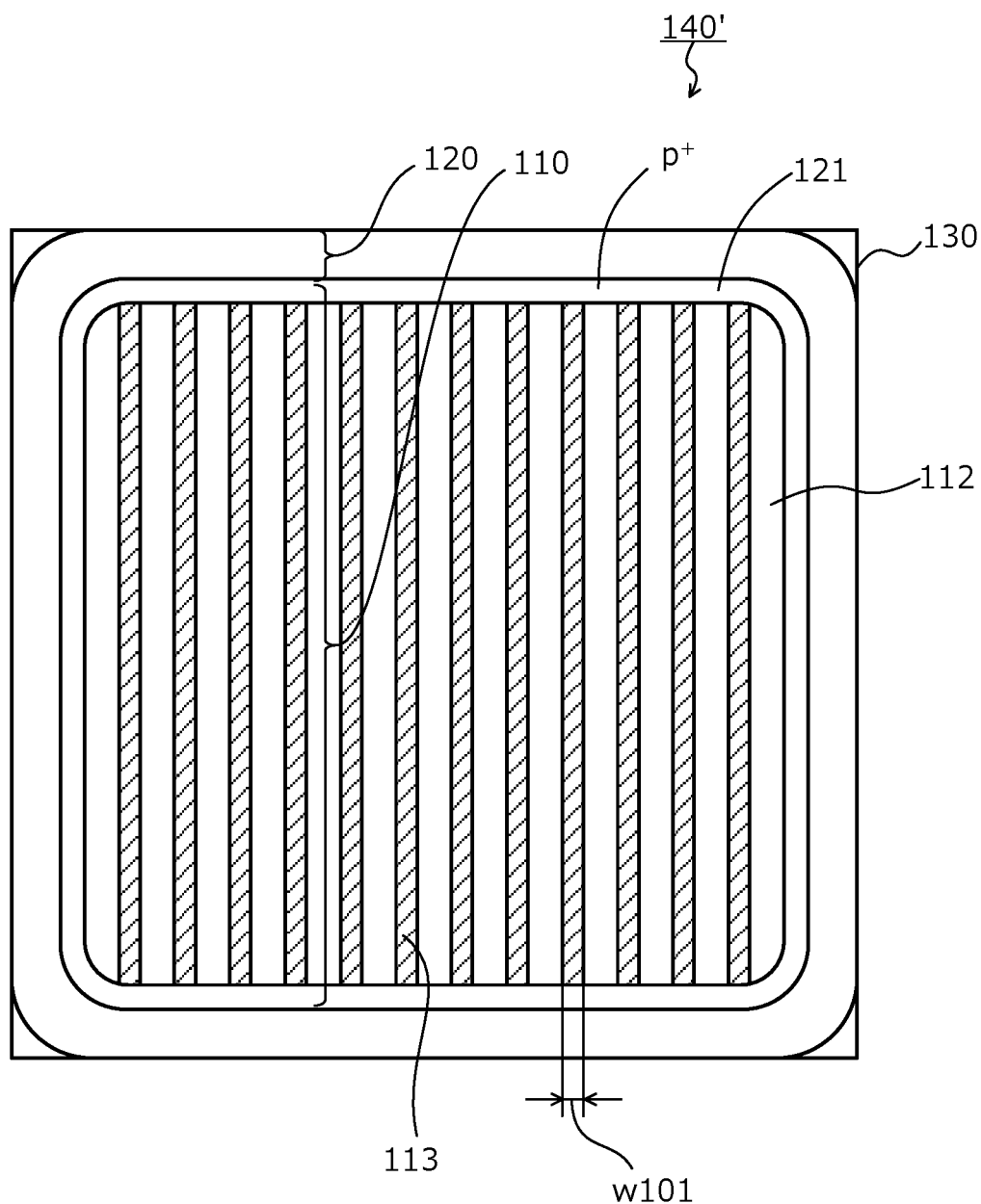
FIG. 32 is a plan view of another example of a conventional silicon carbide semiconductor device when viewed from a front side of a semiconductor substrate.

First, problems associated with the conventional techniques are discussed. In fabricating the conventional silicon carbide semiconductor device 140' described above (silicon carbide diode having a JBS structure, refer to FIG. 32), when the active region 110 is to have the same surface area, the greater the bonded surface area of the p-type regions 113 and the ohmic electrodes (not depicted) is set to enhance the surge current withstand amount, the smaller the bonded surface area between the n⁻-type drift region 112 and Schottky electrodes (not depicted) becomes. Therefore, during forward bias, the electron current amount from the n⁻-type drift region 112 to the Schottky electrodes decreases and reduction of the forward voltage (Vf) is difficult.

To increase the bonded surface area of the n⁻-type drift region 112 and the Schottky electrodes as much as possible for a necessary bonded surface area between the bonded surface area of the p-type regions 113 and the ohmic electrodes to obtain a predetermined surge current withstand amount, the ohmic electrodes are formed only on the p-type regions 113, and between adjacent p-type regions 113, Schottky junctions suffice to be formed with the Schottky electrodes in an entire area of the surface of the n⁻-type drift region 112. Nonetheless, the following problem arises in forming the ohmic electrodes on the front surface of the semiconductor substrate 130 containing silicon carbide.

Figure 29:
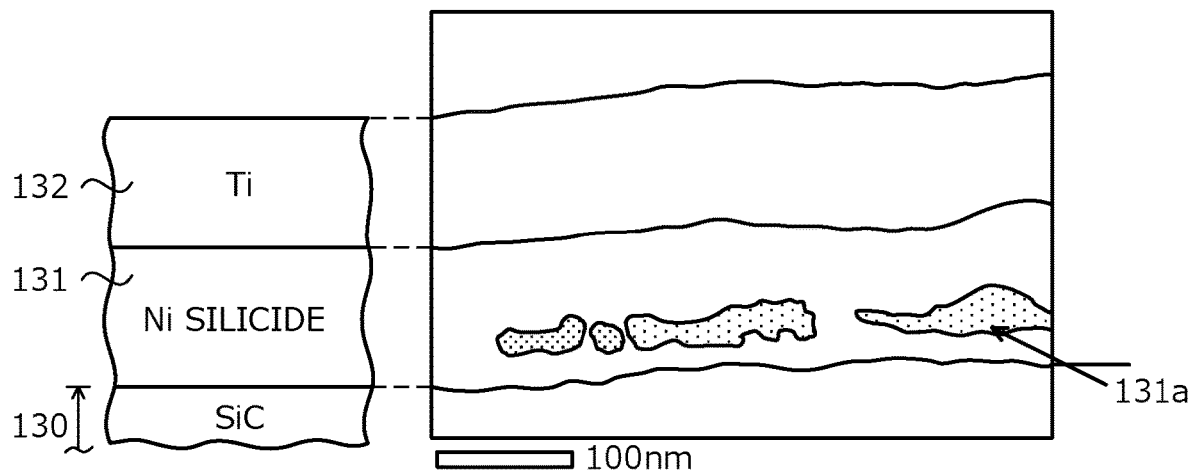
FIG. 29 is a diagram schematically depicting an ohmic electrode on the semiconductor substrate containing silicon carbide.
Figure 30:
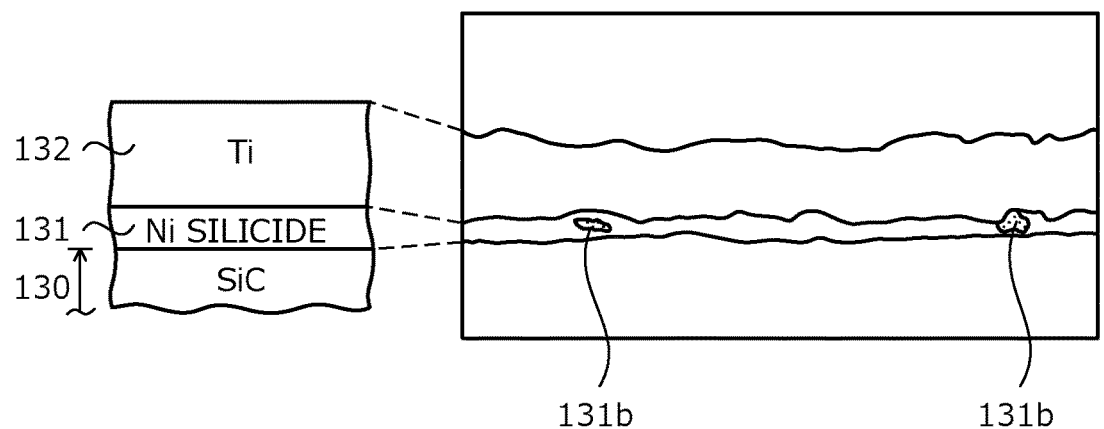
FIG. 30 is a diagram schematically depicting the ohmic electrode on the semiconductor substrate containing silicon carbide.
Figure 31:
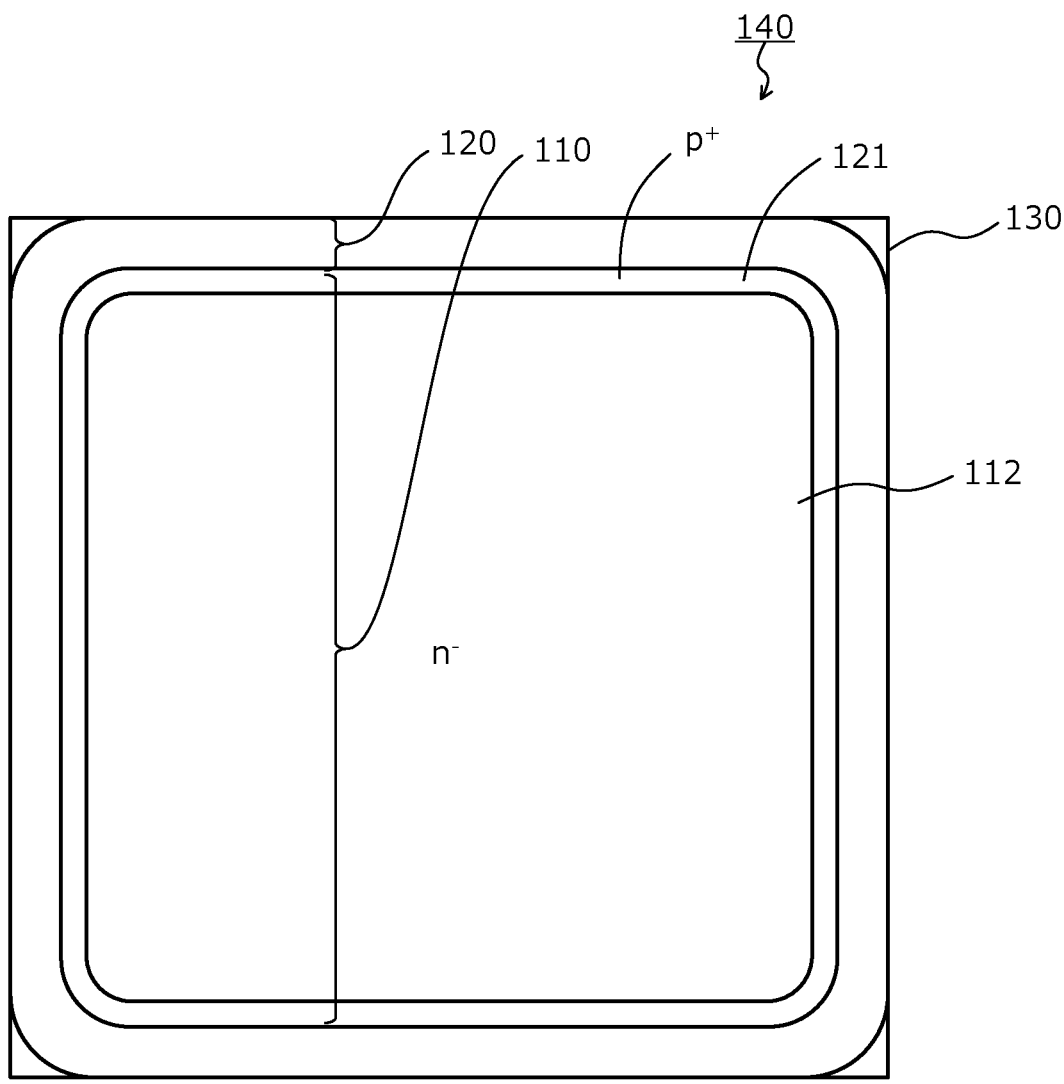
FIG. 31 is a plan view depicting a state of a conventional silicon carbide semiconductor device when viewed from a front side of a semiconductor substrate thereof.

A problem that occurs with the conventional silicon carbide semiconductor device 140' is described taking, as an example, an instance in which a nickel silicide film 131 is formed on the front surface of the semiconductor substrate 130 as ohmic electrodes. FIGS. 29 and 30 are diagrams schematically depicting the ohmic electrodes on the semiconductor substrate containing silicon carbide. FIG. 29 is an enlarged view of a cross-section of a portion of the nickel silicide film 131 on the front surface of the semiconductor substrate 130. FIG. 30 is a cross-sectional view depicting a state of surface of the nickel silicide film 131 (interface with a titanium film 132 that is outermost).

Normally, in forming the ohmic electrodes on the semiconductor substrate 130 containing silicon carbide, in surface regions of the semiconductor substrate 130, p⁺-type regions (not depicted) are formed having a high impurity concentration by ion implantation. Subsequently, a metal film is formed on the p⁺-type regions and contains a metal species such as, for example, nickel (hereinafter, nickel film); nickel atoms therein are caused to react with silicon atoms in the semiconductor substrate 130 by a heat treatment, whereby portions of the nickel film in contact with the p⁺-type regions are converted into a silicide, thereby forming the nickel silicide film 131 that becomes the ohmic electrodes.

When the nickel silicide film 131 is formed by the conversion of the nickel film into a silicide, of the silicon atoms and carbon atoms contained in the silicon carbide of the semiconductor substrate 130, excess carbon (hatched portion) 131a left unused in the silicide conversion precipitates in the nickel silicide film 131 (FIG. 29). When the excess carbon 131a precipitates as a layer, adhesiveness between the nickel silicide film 131 and the semiconductor substrate 130 decreases, and the nickel silicide film 131 peels from the semiconductor substrate 130, together with the layer of the excess carbon 131a.

Further, when the generation of the nickel silicide film 131 itself is poor, voids 131b are generated in the nickel silicide film 131 and step coverage (surface coating) of the nickel silicide film 131 becomes poor. Therefore, unevenness occurs at the surface of the titanium film 132 due to unevenness occurring at the surface of the nickel silicide film 131 and due to voids occurring between the nickel silicide film 131 and the titanium film 132 formed on the nickel silicide film 131 (FIG. 30).

Further, a width w101 of the p-type regions 113 (width in a direction orthogonal to a direction in which the p-type regions 113 extend in a striped pattern) (refer to FIG. 32) is as narrow as a few μm or less and therefore, processing of a stacked layer of metals of two different metals (aluminum and nickel) of differing etching rates in a fine pattern is difficult and the width of the ohmic electrodes formed by this stacked layer becomes wider than the width w101 of the p-type regions 113. In Japanese Laid-Open Patent Publication No. 2005-276978, while ohmic electrodes of a fine pattern are formed by self-alignment, it was confirmed by the present inventors that contact resistance between the p-type regions and the ohmic electrodes is not sufficiently reduced.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
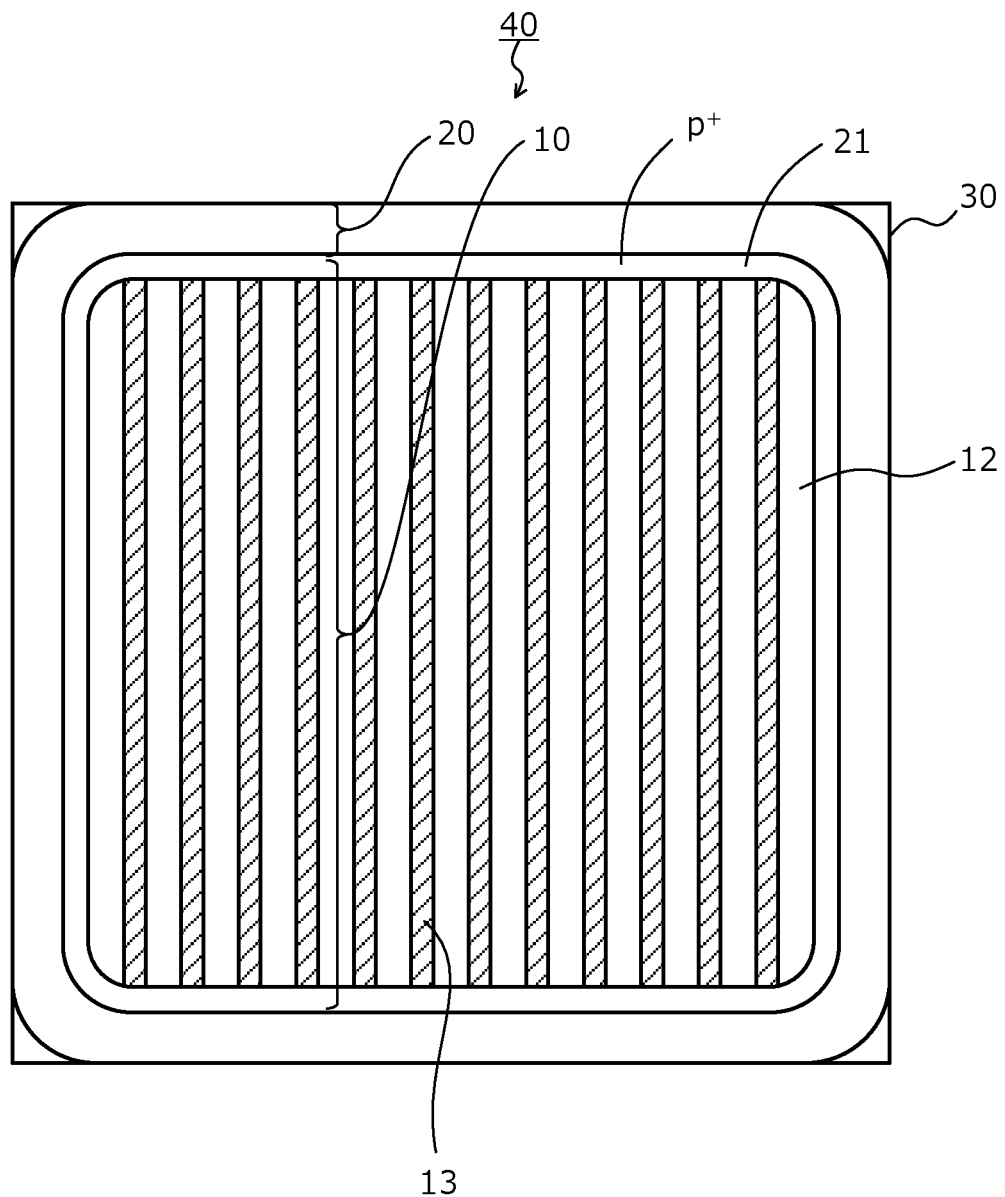
FIG. 1 is a plan view depicting a layout when a silicon carbide semiconductor device according to a first embodiment is viewed from a front side of a semiconductor substrate.
Figure 2:
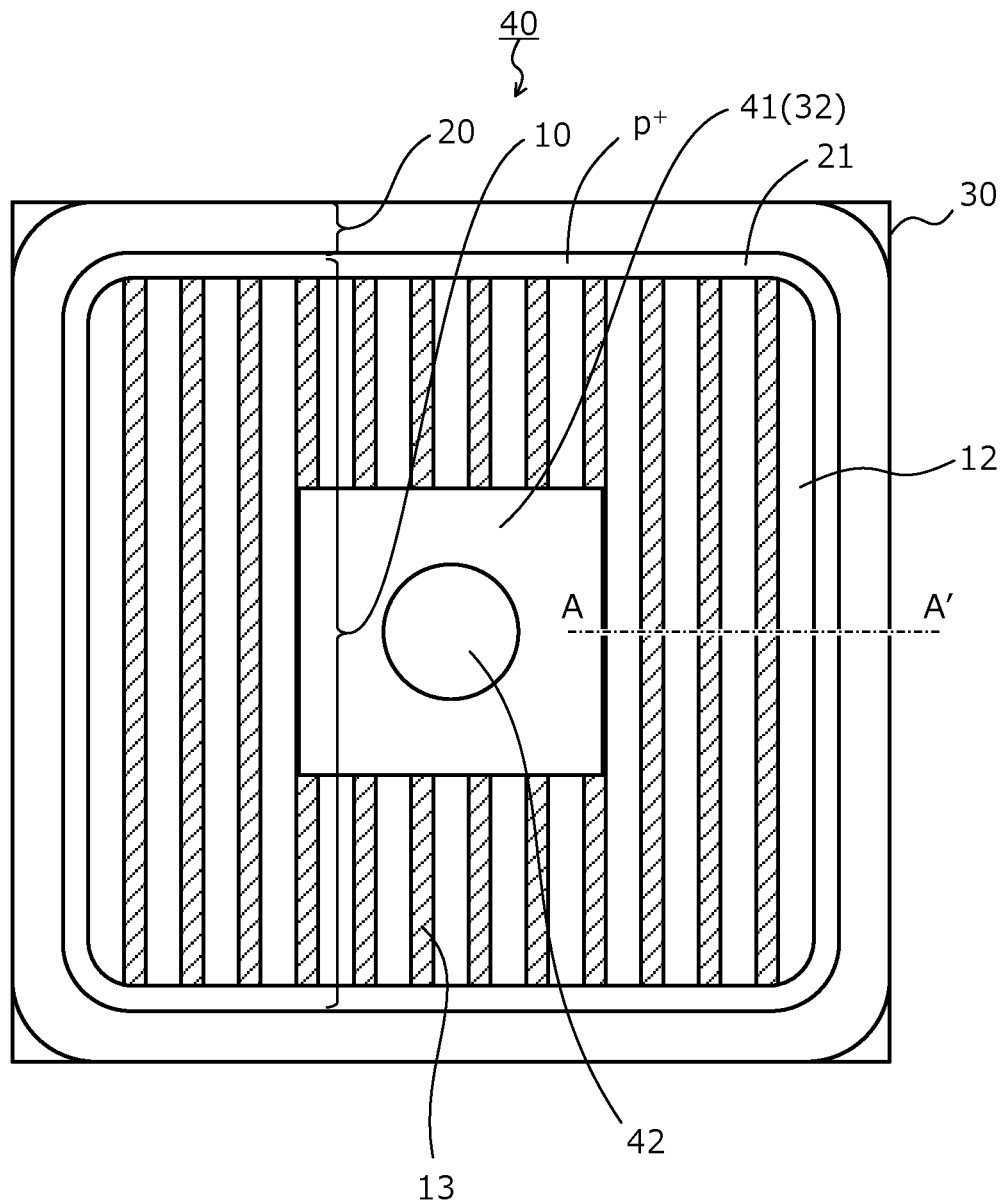
FIG. 2 is a plan view depicting a layout when the silicon carbide semiconductor device according to the first embodiment is viewed from the front side of the semiconductor substrate.

A structure of a silicon carbide semiconductor device according to a first embodiment is described. FIGS. 1 and 2 are plan views depicting a layout when the silicon carbide semiconductor device according to the first embodiment is viewed from a front side of a semiconductor substrate. FIG. 1 depicts an example of a layout of p-type regions (second-conductivity-type regions) 13 configuring a JBS structure. FIG. 2 depicts an example of a layout of a bonding pad 41 among components of a front surface of a semiconductor substrate (semiconductor chip) 30 containing silicon carbide (SiC). In FIGS. 1 and 2, p⁺-type contact regions (second-conductivity-type high-concentration regions) 14 are not depicted.

A silicon carbide semiconductor device 40 according to the first embodiment and depicted in FIGS. 1 and 2 is a silicon carbide diode having an active region 10 in which on the front side of the semiconductor substrate 30, a SBD structure configured by Schottky junctions between a front electrode (first electrode) 16 (refer to FIG. 3) and an n⁻-type drift region (first-conductivity-type region) 12, and a JBS structure configured by pn junctions between the p-type regions 13 and the n⁻-type drift region 12 are both present. Between the p-type regions 13 and the front electrode 16, the p⁺-type contact regions 14 in ohmic contact with the front electrode 16 (refer to FIG. 3) are disposed.

The n⁻-type drift region 12, the p-type regions 13, and the p⁺-type contact regions 14 are disposed in the semiconductor substrate 30 at a front surface of the semiconductor substrate 30 in, for example, a striped patterned extending in a direction parallel to the front surface of the semiconductor substrate 30. Portions of the n⁻-type drift region 12 and the p-type regions 13 contact one another and are disposed to repeatedly alternate one another in a lateral direction orthogonal to a longitudinal direction in which the striped pattern extends. Portions of the n⁻-type drift region 12 between adjacent p-type regions 13 of the p-type regions 13 are exposed at the front surface of the semiconductor substrate 30.

The active region 10 is a region through which current flows when the silicon carbide diode is in an ON state. The active region 10, for example, has a substantially rectangular shape in a plan view and is disposed in substantially a center of the semiconductor substrate 30. An edge termination region 20 is a region between the active region 10 and ends of the semiconductor substrate 30, and surrounds a periphery of the active region 10. The edge termination region 20 is a region that mitigates electric field of the n⁻-type drift region 12 of the front side of the semiconductor substrate 30 and sustains a breakdown voltage. The breakdown voltage is a voltage limit at which no erroneous operation and/or destruction of an element device occurs.

Figure 3:
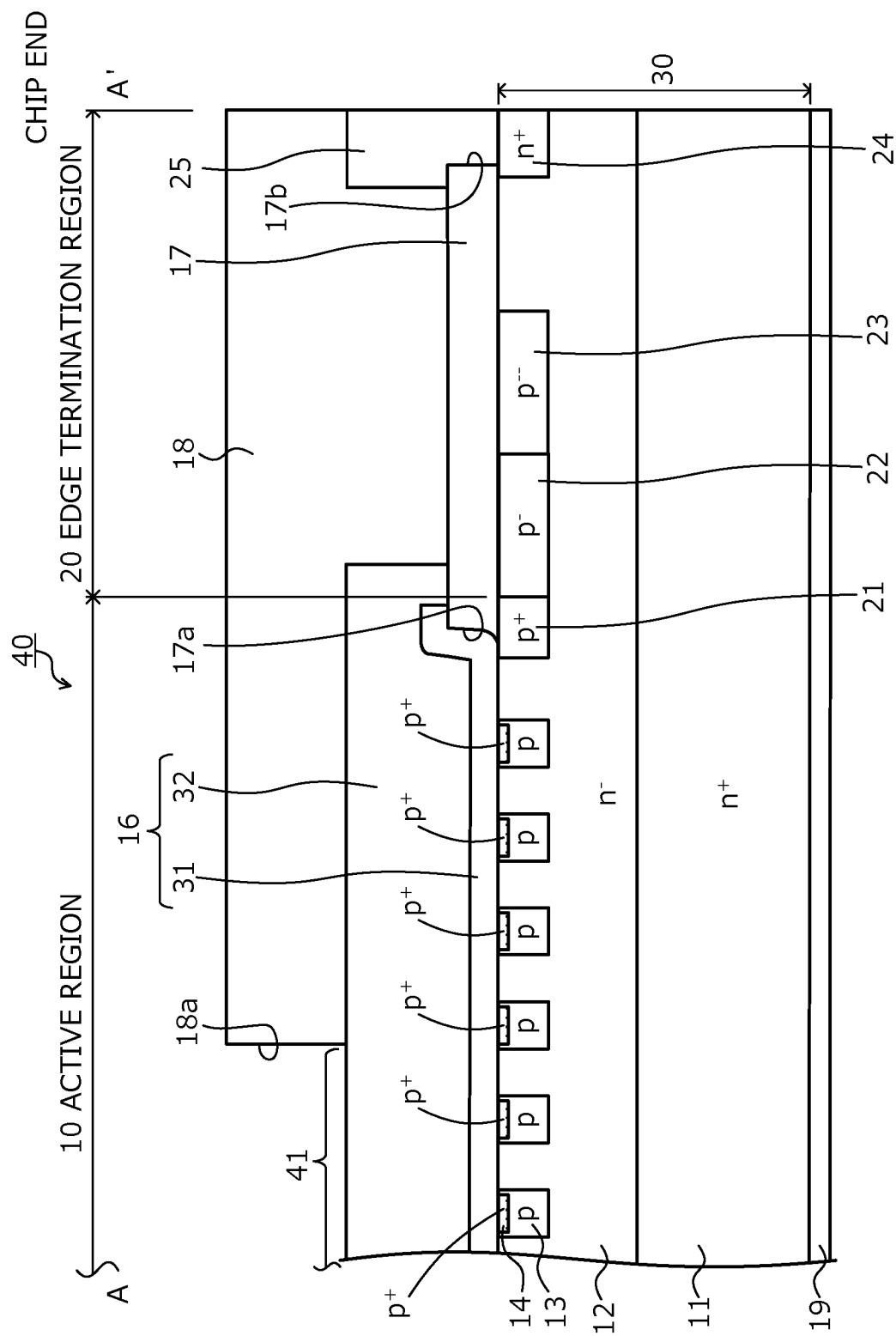
FIG. 3 is a cross-sectional view depicting a structure along cutting line A-A' in FIG. 2.

In the edge termination region 20, a voltage withstanding structure such as a junction termination extension (JTE) structure is disposed (refer to FIG. 3). The JTE structure is a voltage withstanding structure in which, from a center-side (side thereof nearest the center of the semiconductor substrate 30) thereof to end-sides (sides thereof nearest the ends of the semiconductor substrate 30) thereof, plural p-type regions (in FIG. 3, reference numerals 22, 23) having differing impurity concentrations are disposed in descending order of impurity concentration, in a substantially rectangular concentric pattern surrounding a periphery of the active region 10 and centered around a center of the active region, in a plan view.

At a border between the active region 10 and the edge termination region 20, a field limiting ring (FLR) 21 is disposed. The FLR 21 is a p⁺-type region surrounding a periphery of the active region 10 in a substantially rectangular shape, disposed between the active region 10 and a later-described p⁻-type region 22 (refer to FIG. 3) configuring the JTE structure, the FLR 21 being disposed in contact with the p⁻-type region 22. The FLR 21 may be in contact with the p-type regions 13 and the p⁺-type contact regions 14, in the longitudinal direction in which the p-type regions 13 extend in the striped pattern.

The front electrode 16 is provided in the active region 10, on the front surface of the semiconductor substrate 30. The front electrode 16 is in contact with the n⁻-type drift region 12 and the p⁺-type contact regions 14, and is electrically connected to the n⁻-type drift region 12 and the p⁺-type contact regions 14. On the front surface of the semiconductor substrate 30, a passivation film 18 (refer to FIG. 3) is provided. The passivation film 18 functions as a protective film protecting device elements and the front electrode 16 on the front side of the semiconductor substrate 30.

In the passivation film 18, an opening 18a that exposes a portion of the front electrode 16 is provided. The portion of the front electrode 16 exposed by the opening 18a of the passivation film 18 functions as the bonding pad 41. The bonding pad 41, for example, is disposed in the center of the semiconductor substrate 30. A non-depicted aluminum (Al) wire, which is a most common wiring connection when current is supplied to the bonding pad 41, is bonded (joined) to the bonding pad 41.

In FIG. 2, a bonding region 42 of the bonding pad 41 and the aluminum wire (not depicted) is indicated by a circular planar shape. For the bonding region 42 of the bonding pad 41 and the aluminum wire, for example, a mathematical surface area of about 1 square-mm has to be assumed when the aluminum wire has a diameter of 500 μm and is bonded to the bonding pad 41. A reason for this is that, at a surface of the semiconductor substrate 30, when surge voltage is applied and surge current flows in the forward direction, the flow of the surge current differs depending on the breakdown voltage of the silicon carbide diode.

Figure 4:
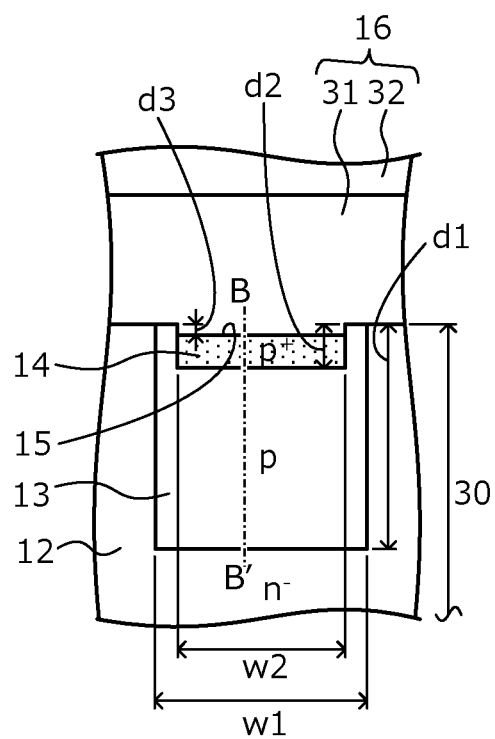
FIG. 4 is an enlarged view of a portion of the cross-sectional view depicted in FIG. 3.
Figure 5:
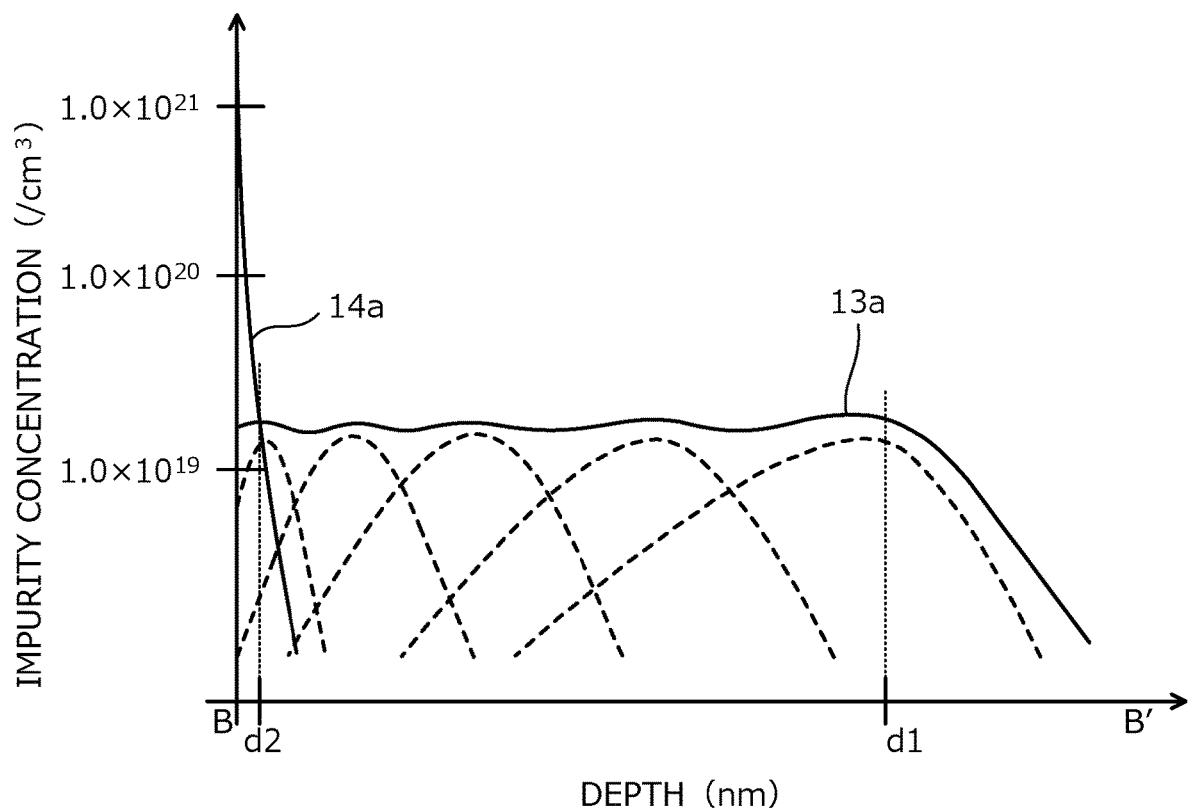
FIG. 5 is a characteristics diagram depicting impurity concentration distribution along cutting line B-B' in FIG. 4.

Next, a cross-section of the structure of the silicon carbide semiconductor device 40 according to the first embodiment is described. FIG. 3 is a cross-sectional view depicting the structure along cutting line A-A' in FIG. 2. FIG. 4 is an enlarged view of a portion of the cross-sectional view depicted in FIG. 3. FIG. 4 depicts an enlarged view near the p-type regions 13 configuring the JBS structure. FIG. 5 is a characteristics diagram depicting impurity concentration distribution along cutting line B-B' in FIG. 4. FIG. 5 depicts impurity concentration distributions 13a, 14a of the p-type regions 13 and the p⁺-type contact regions 14 configuring the JBS structure.

As described above, the silicon carbide semiconductor device 40 according to the first embodiment includes the SBD structure and the JBS structure of the silicon carbide diode in the active region 10 of the semiconductor substrate 30 containing silicon carbide, and includes the JTE structure as a voltage withstanding structure in the edge termination region 20. The semiconductor substrate 30 is an epitaxial substrate in which an n⁻-type epitaxial layer constituting the n⁻-type drift region 12 is stacked on a front surface of an n⁺-type starting substrate 11 containing silicon carbide. The n⁺-type starting substrate 11 is an n⁺-type cathode region.

The semiconductor substrate 30 has a main surface (surface of the n⁻-type epitaxial layer constituting the n⁻-type drift region 12) including the n⁻-type drift region 12 and regarded as the front surface and a main surface (back surface of the n⁺-type starting substrate 11) including the n⁺-type starting substrate 11 and regarded as a back surface. In the active region 10, in a surface region of the semiconductor substrate 30 at the front surface thereof, at least one of the p-type regions 13 configuring the JBS structure is selectively provided. The p-type regions 13 are provided between the front surface of the semiconductor substrate 30 and the n⁻-type drift region 12, in contact with the n⁻-type drift region 12.

The p-type regions 13 are diffused regions in which, as described hereinafter, a p-type impurity implanted by a first ion implantation is diffused radially. The p-type regions 13 have the impurity concentration distribution 13a in which, in a depth direction from the front surface of the semiconductor substrate 30, the impurity concentration has a uniform box profile (FIG. 5). The impurity concentration being uniform means substantially the same impurity concentration within a range including an allowable error due to process variation. The impurity concentration of the p-type regions 13 is, for example, in a range from about $1\times10^{18}/cm^3$ to $2\times10^{19}/cm^3$.

FIG. 5 depicts the impurity concentration distribution 13a of the p-type regions 13 in an instance in which the p-type regions 13 are formed by dividing and performing the first ion implantation in multiple stages (here, 5 stages) by differing acceleration energies. In FIG. 5, the impurity concentration distributions for the first ion implantation divided into and performed in the 5 stages are indicated by dashed lines, respectively. The impurity concentration distribution 13a of the p-type regions 13 is an integral of all of the impurity concentration distributions of the first ion implantation divided into and performed in the 5 stages. A depth d1 of the p-type regions 13 from the front surface of the semiconductor substrate 30 may be, for example, about 500 nm.

The p⁺-type contact regions 14 are provided between the front surface of the semiconductor substrate 30 and the p-type regions 13, in contact with the p-type regions 13. The p⁺-type contact regions 14, as described hereinafter, are diffused regions formed in surface regions of the p-type regions 13 by aluminum atoms thermally diffused from an aluminum film 53 deposited on the front surface of the semiconductor substrate 30 (refer to FIGS. 18 to 20). Impurities are less likely to be thermally diffused in any direction in silicon carbide and therefore, the aluminum atoms thermally diffused from the aluminum film 53 are introduced into the p$^+$-type contact regions 14 at a high impurity concentration.

A peak value of the impurity concentration of the p$^+$-type contact regions 14 (maximum value, hereinafter, peak concentration) is higher than the impurity concentration of the p-type regions 13. The p$^+$-type contact regions 14 exhibit a peak concentration at the front surface of the semiconductor substrate 30 (contact surface with the aluminum film 53), and have the impurity concentration distribution 14a in which the impurity concentration decreases with increasing distance from the front surface of the semiconductor substrate 30 in the depth direction (increasing depth) (FIG. 5). The p$^+$-type contact regions 14 are regions from bottoms of later-described recesses 15, to a depth of an intersection of the impurity concentration distribution 14a of the p$^+$-type contact regions 14 and the impurity concentration distribution 13a of the p-type regions 13 (depth position of a later-described depth d2).

The peak concentration of the p$^+$-type contact regions 14 is, for example, at least about $3\times10^{20}$/cm$^3$ assuring ohmic contact between a later-described titanium film 31 and the p$^+$-type contact regions 14. Preferably, the peak concentration of the p$^+$-type contact regions 14 may be, for example, at least about $3\times10^{21}$/cm$^3$. By setting the peak concentration of the p$^+$-type contact regions 14 to be at least $3\times10^{21}$/cm$^3$, ohmic contact between the titanium film 31 and the p$^+$-type contact regions 14 may assuredly have a sufficiently low resistance.

The depth d2 of the p$^+$-type contact regions 14 from the front surface of the semiconductor substrate 30 is shallower than the depth d1 of the p-type regions 13 from the front surface of the semiconductor substrate 30. In particular, the depth d2 of the p$^+$-type contact regions 14 from the front surface of the semiconductor substrate 30 is, for example, in a range from about 10 nm to 50 nm. The p$^+$-type contact regions 14 are exposed at inner walls of the recesses 15 formed at the front surface of the semiconductor substrate 30, and are in ohmic contact with the later-described titanium film 31 at the inner walls of the recesses 15 (substantially bottoms of the inner walls) (FIG. 4).

A width w2 of the p$^+$-type contact regions 14 may be substantially equal to a width w1 of the p-type regions 13. By setting the width w2 of the p$^+$-type contact regions 14 to be equal to the width w1 of the p-type regions 13, the p-type regions 13 are not exposed at the front surface of the semiconductor substrate 30 or at the inner walls of the recesses 15. As a result, high-resistance Schottky junctions between the p-type regions 13 and the titanium film 31 are not formed and therefore, as compared to an instance in which the p-type regions 13 are exposed at the front surface of the semiconductor substrate 30 and the inner walls of the recesses 15, forward voltage (Vf) of the silicon carbide diode may be reduced.

The width w2 of the p$^+$-type contact regions 14 may be narrower than the width w1 of the p-type regions 13. By setting the width w2 of the p$^+$-type contact regions 14 to be narrower than the width w1 of the p-type regions 13, design margins may be taken to enhance alignment accuracy of a mask (portions left of a later-described interlayer insulating film 17, refer to FIG. 13) used when the p$^+$-type contact regions 14 are formed. As a result, the p$^+$-type contact regions 14 may be disposed between the front surface of the semiconductor substrate 30 and the p-type regions 13 with favorable alignment accuracy.

As described above, while the width w2 of the p$^+$-type contact regions 14 may be at most the width w1 of the p-type regions 13, the width w2 may be wider than the width w1 of the p-type regions 13. A reason for this is that even when the width w2 of the p$^+$-type contact regions 14 is wider than the width w1 of the p-type regions 13, due to contact between the p$^+$-type contact regions 14 and the titanium film 31, ohmic contact may be formed having a low resistance about equal to that in the conventional structure in which ohmic contact is formed between the semiconductor substrate 130 containing silicon carbide and the nickel silicide (NiSi) film 131 (refer to FIGS. 29, 30).

On the other hand, in an instance in which the width w2 of the p$^+$-type contact regions 14 is wider than the width w1 of the p-type regions 13, pn junctions are formed between the p$^+$-type contact regions 14 and the n$^-$-type drift region 12. Compared to an instance in which the p$^+$-type contact regions 14 and the n$^-$-type drift region 12 are not in contact with one another, leak current during reverse bias increases, however, as described hereinafter, no silicide film is present between the semiconductor substrate 30 and the front electrode 16 and therefore, as compared to the conventional structure having the nickel silicide film 131, leak current during reverse bias may be suppressed.

In the semiconductor substrate 30 at the front surface thereof, the recesses 15 are formed in the depth direction at positions corresponding to the p$^+$-type contact regions 14, respectively. The recesses 15, as described hereinafter, are formed by removing portions of the semiconductor substrate 30 at the front surface thereof during dry etching for opening the interlayer insulating film 17 used as a mask when the p$^+$-type contact regions 14 are formed (refer to FIG. 13). The recesses 15 have a depth d3 shallower from the front surface of the semiconductor substrate 30 than is the depth d1 of the p-type regions 13 and the recesses 15 have a width substantially equal to the width w2 of the p$^+$-type contact regions 14.

At the interface between the active region 10 and the edge termination region 20, between the front surface of the semiconductor substrate 30 and the n$^-$-type drift region 12, the FLR 21 is selectively provided in contact with the n$^-$-type drift region 12. The FLR 21 is provided extending from the active region 10 to the edge termination region 20. The FLR 21, for example, is formed concurrently with the p-type regions 13 and has a same depth and box profile as the p-type regions 13. The FLR 21, for example, may be in contact with ends of the p-type regions 13 and the p$^+$-type contact regions 14 extending in the longitudinal direction parallel to the front surface of the semiconductor substrate 30.

In the edge termination region 20, between the front surface of the semiconductor substrate 30 and the n$^-$-type drift region 12, and in contact with the n$^-$-type drift region 12, at least one p-type region (here, two: the p$^-$-type region 22 and a p$^{--}$-type region 23) configuring the JTE structure and having an impurity concentration of, for example, at most about $1\times10^{17}$/cm$^3$, and an n$^+$-type channel stopper region 24 are each selectively provided. The p$^-$-type region 22 is disposed adjacent to the FLR 21, on an outer peripheral side of the FLR 21. The p$^{--}$-type region 23 is disposed adjacent to the p$^-$-type region 22, on an outer peripheral side of the p$^-$-type region 22.

The n$^+$-type channel stopper region 24 is disposed separate from the p$^{--}$-type region 23, closer to the ends of the semiconductor substrate 30 than is the p$^{--}$-type region 23.

The n+-type channel stopper region 24 is exposed at the ends of the semiconductor substrate 30 (chip ends). While not depicted, the n+-type channel stopper region 24 is disposed along an outer periphery of the semiconductor substrate 30, in a substantially rectangular shape so as to surround a periphery of the JTE structure. Depths of the p−-type region 22, the p−-type region 23, and the n+-type channel stopper region 24 may be, for example, equal to the depth of the p-type regions 13.

In the interlayer insulating film 17 covering the front surface of the semiconductor substrate 30, a contact hole 17a exposing substantially an entire area of the front surface of the semiconductor substrate 30 in the active region 10 and a contact hole exposing the n+-type channel stopper region 24 are provided. The n−-type drift region 12 and the p+-type contact regions 14 in the active region 10 (in an instance in which the width w2 of the p+-type contact regions 14 is less than the width w1 of the p-type regions 13, the p-type regions 13 as well), and an inner peripheral portion of the FLR 21 are exposed in the contact hole 17a of the interlayer insulating film 17.

In the contact hole 17a, on the front surface of the semiconductor substrate 30, the front electrode 16 is provided. The front electrode 16 has a stacked structure in which the titanium film 31 and an aluminum alloy film (metal film containing aluminum) 32 are sequentially stacked. The titanium film 31 is provided in an entire area of the front surface of the semiconductor substrate 30 in the contact hole 17a to be in contact with the n−-type drift region 12, the p+-type contact regions 14, and the FLR 21 (in an instance in which the width w2 of the p+-type contact regions 14 is less than the width w1 of the p-type regions 13, the p-type regions 13 as well).

Contact portions of the titanium film 31 in contact with the n−-type drift region 12 are Schottky electrodes forming Schottky junctions with the n−-type drift region 12. Contact portions of the titanium film 31 in contact with the p+-type contact regions 14 are ohmic electrodes forming ohmic contacts with the p+-type contact regions 14. Between the titanium film 31 and the semiconductor substrate 30 is free of a silicide film. The titanium film 31 extends outward on the interlayer insulating film 17 and, for example, terminates at a position facing the FLR 21 in the depth direction. The active region 10 includes the FLR 21 and an area surrounded by the FLR 21.

The aluminum alloy film 32 covers an entire area of the surface of the titanium film 31 and is electrically connected to the n−-type drift region 12, the p-type regions 13, the p+-type contact regions 14, and the FLR 21 via the titanium film 31. The aluminum alloy film 32 extends on the interlayer insulating film 17, closer to the ends of the semiconductor substrate 30 than does the titanium film 31 and, for example, terminates at a position facing the p−-type region 22 in the depth direction. The aluminum alloy film 32 is, for example, an aluminum silicon (AlSi) film. Instead of the aluminum alloy film 32, an aluminum film may be provided.

A channel stopper electrode 25 is in contact with and electrically connected to the n+-type channel stopper region 24 via a contact hole in the interlayer insulating film 17. The channel stopper electrode 25 may be, for example, an aluminum alloy film formed concurrently with the aluminum alloy film 32. A portion of the front surface of the semiconductor substrate 30 excluding a portion thereof in contact with the front electrode 16 and the channel stopper electrode 25 is covered by the interlayer insulating film 17.

The passivation film 18 containing a polyimide is provided outermost on the front surface of the semiconductor substrate 30.

The passivation film 18 is a protective film that protects the front electrode 16, the interlayer insulating film 17, and the channel stopper electrode 25. In the passivation film 18, in the active region 10, the opening 18a that exposes a portion of the aluminum alloy film 32 is provided. A portion of the front electrode 16 exposed by the opening 18a of the passivation film 18 functions as the bonding pad 41. A back electrode (second electrode) 19 is provided in an entire area of the back surface of the semiconductor substrate 30 (back surface of the n+-type starting substrate 11), and is electrically connected to the n+-type starting substrate 11.

Figure 6:
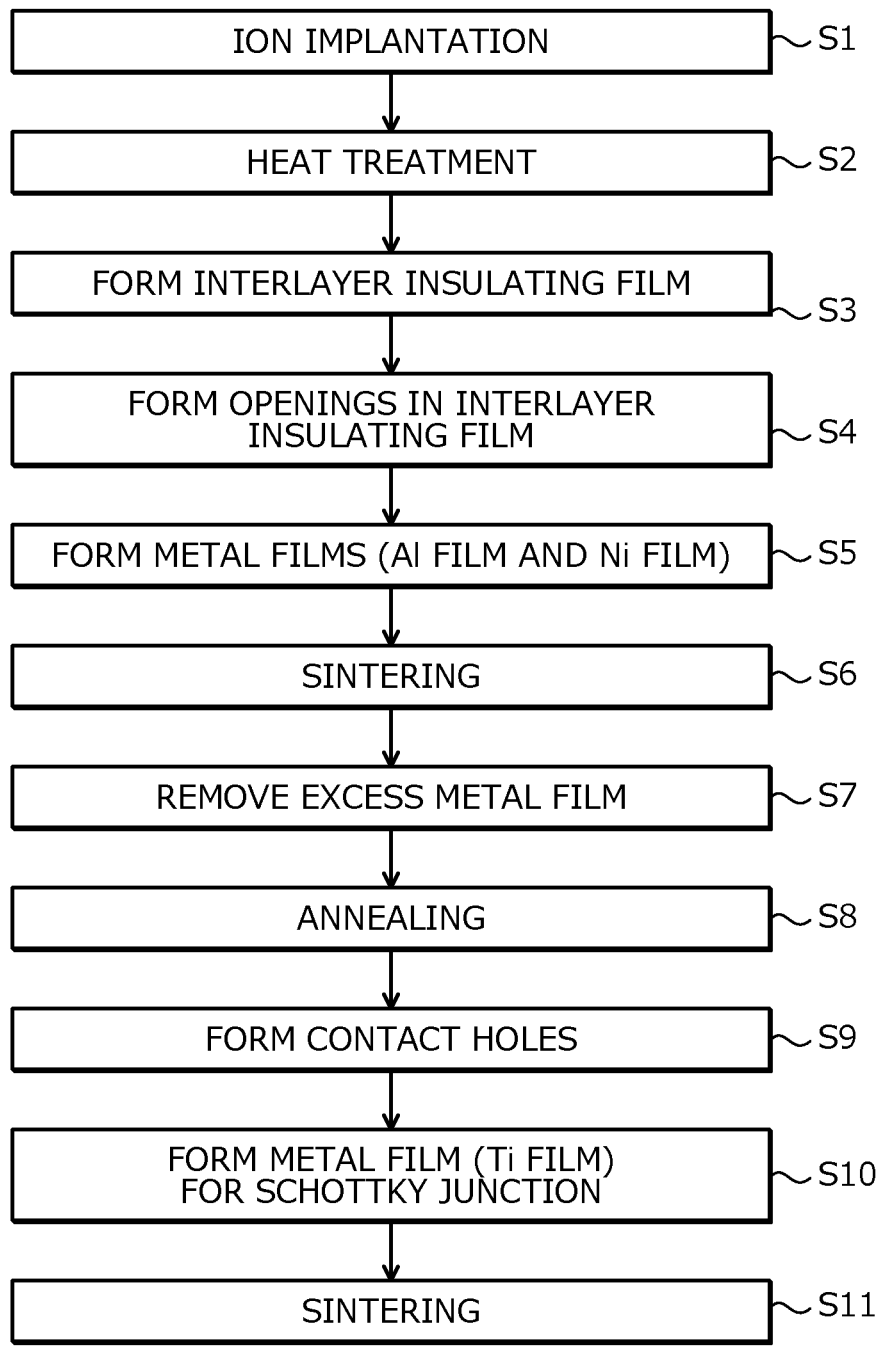
FIG. 6 is a flowchart of an outline of a method of manufacturing the silicon carbide semiconductor device according to the first embodiment.
Figure 18:
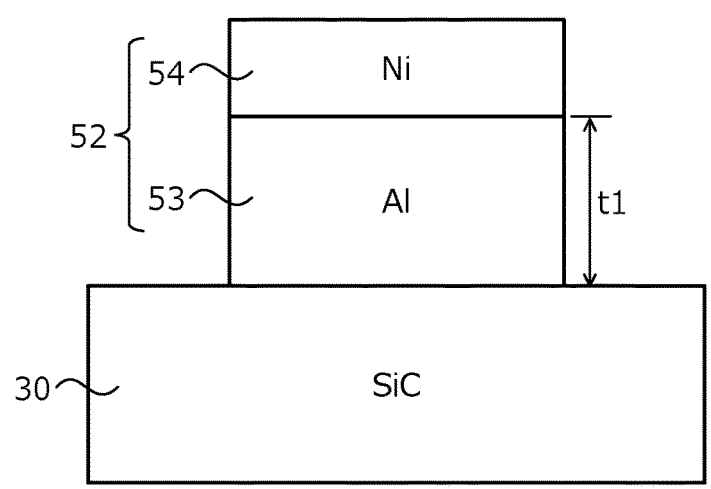
FIG. 18 is a cross-sectional view schematically depicting a state of a front electrode of the silicon carbide semiconductor device according to the first embodiment during manufacture.
Figure 19:
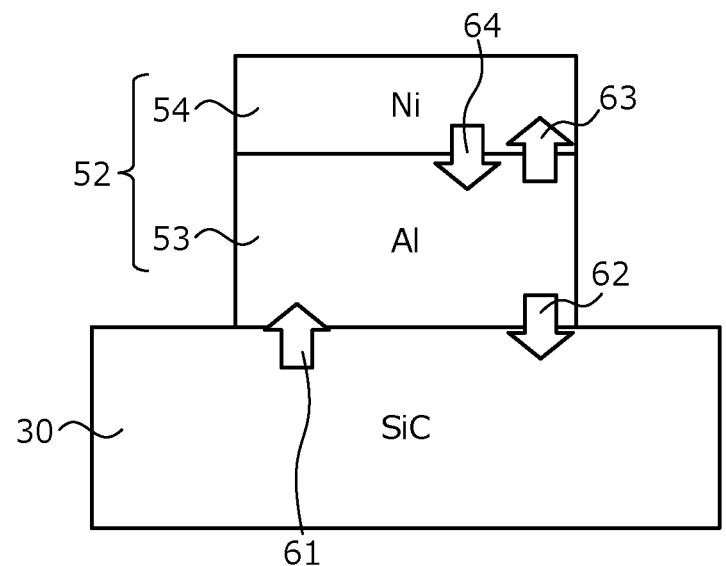
FIG. 19 is a cross-sectional view schematically depicting a state of the front electrode of the silicon carbide semiconductor device according to the first embodiment during manufacture.
Figure 20:
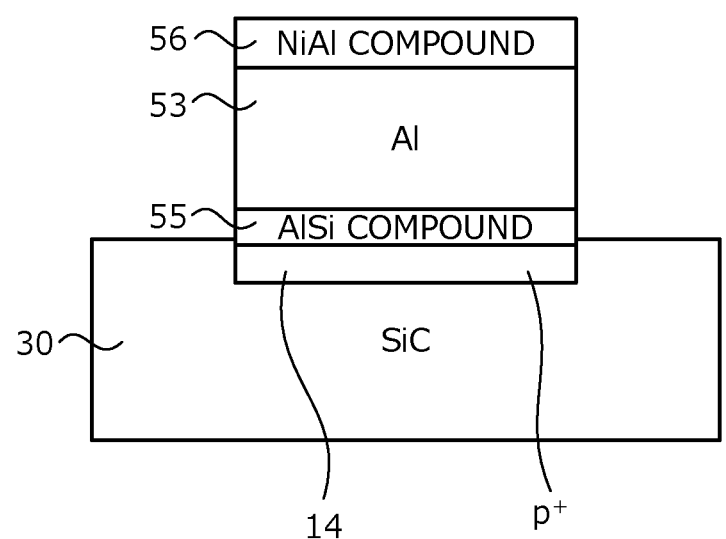
FIG. 20 is a cross-sectional view schematically depicting a state of the front electrode of the silicon carbide semiconductor device according to the first embodiment during manufacture.
Figure 21:
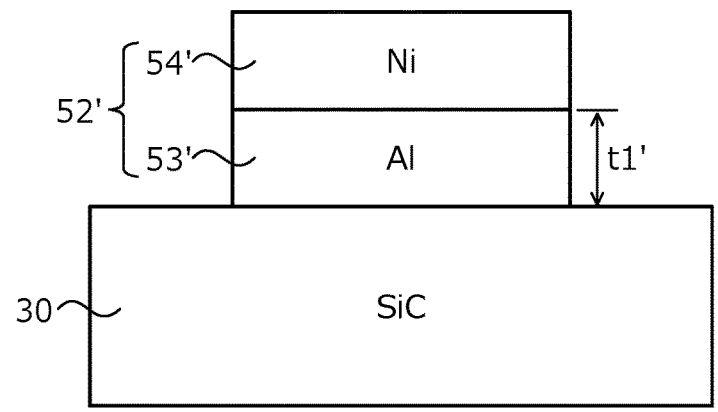
FIG. 21 is a cross-sectional view schematically depicting a state of a front electrode of a silicon carbide semiconductor device of a reference example.
Figure 22:
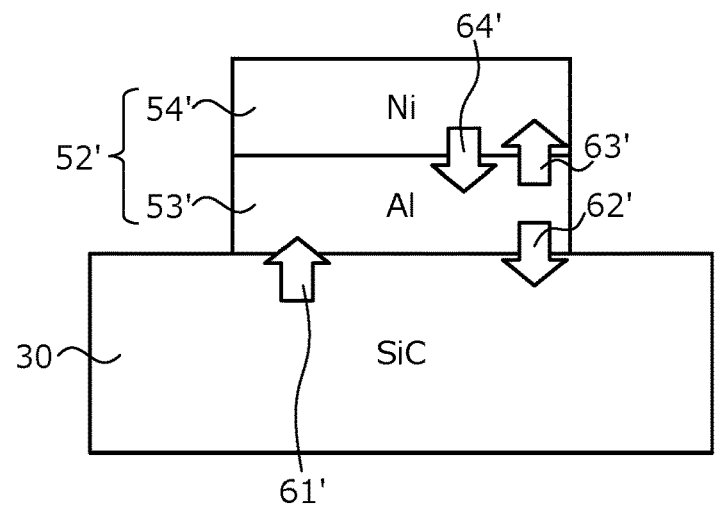
FIG. 22 is a cross-sectional view schematically depicting a state of the front electrode of the silicon carbide semiconductor device of the reference example.
Figure 23:
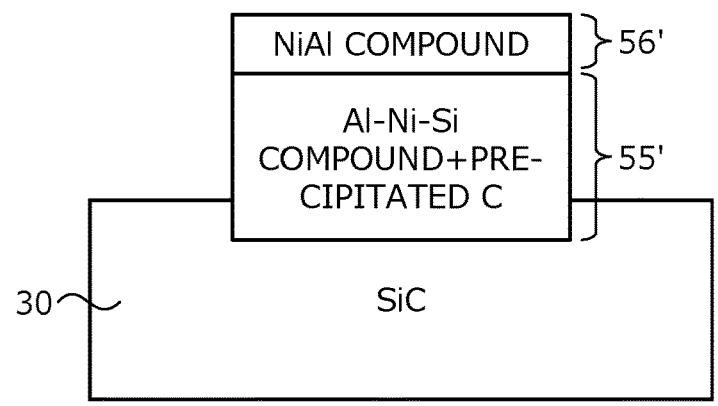
FIG. 23 is a cross-sectional view schematically depicting a state of the front electrode of the silicon carbide semiconductor device of the reference example.

Next, a method of manufacturing the silicon carbide semiconductor device 40 according to the first embodiment is described. FIG. 6 is a flowchart of an outline of the method of manufacturing the silicon carbide semiconductor device according to the first embodiment. FIGS. 7, 8, 9, 10, 11, 12, 13, 14, 15, 16, and 17 are cross-sectional views depicting states of the silicon carbide semiconductor device according to the first embodiment during manufacture. FIGS. 18, 19, and 20 are cross-sectional views schematically depicting states of the front electrode of the silicon carbide semiconductor device according to the first embodiment during manufacture. FIGS. 21, 22, and 23 are cross-sectional views schematically depicting states of a front electrode of a silicon carbide semiconductor device of a reference example.

Figure 7:
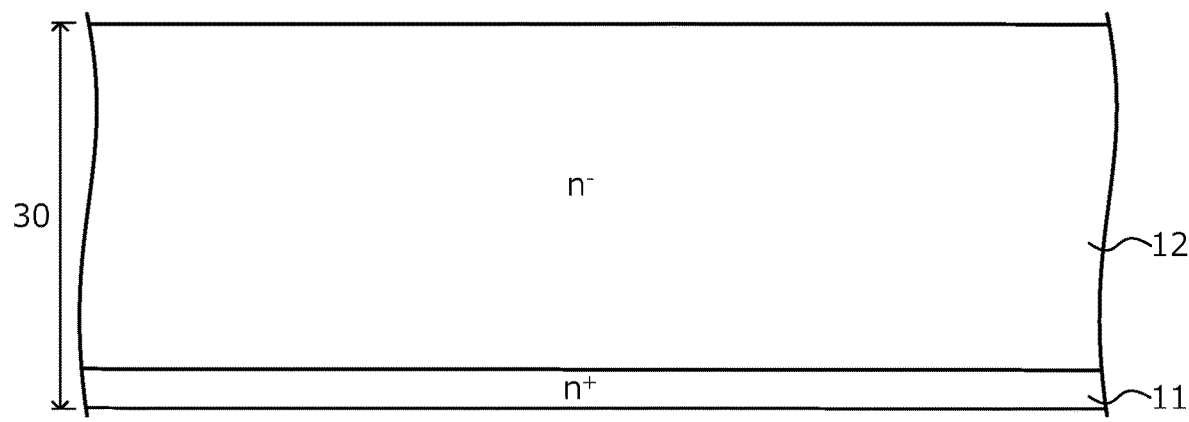
FIG. 7 is a cross-sectional view depicting a state of the silicon carbide semiconductor device according to the first embodiment during manufacture.

First, as depicted in FIG. 7, a four-layer periodic hexagonal (4H—SiC) silicon carbide substrate doped with nitrogen (N) of, for example, about $1\times10^{16}/cm^3$ is prepared as the n+-type starting substrate (semiconductor wafer) 11. The front surface of the n+-type starting substrate 11 may have, for example, an off-angle of about 4 degrees with respect to a (0001) plane. Next, on the front surface of the n+-type starting substrate 11, the n−-type epitaxial layer doped with nitrogen of, for example, about $1\times10^{16}/cm^3$ and constituting the n−-type drift region 12 is epitaxially grown (first process).

A thickness of the n+-type starting substrate 11 constituting the n+-type cathode region may be, for example, about 350 µm. A thickness of the n−-type epitaxial layer constituting the n−-type drift region 12 may be, for example, about 6 µm. By the processes up to here, the semiconductor substrate (semiconductor wafer) 30 in which the n−-type epitaxial layer constituting the n−-type drift region 12 is stacked on the front surface of the n+-type starting substrate 11 is fabricated. As described above, of the semiconductor substrate 30, the main surface that is the surface of the n−-type drift region 12 is assumed to be the front surface and the main surface that is the surface of the n+-type starting substrate 11 is assumed to be the back surface.

Figure 8:
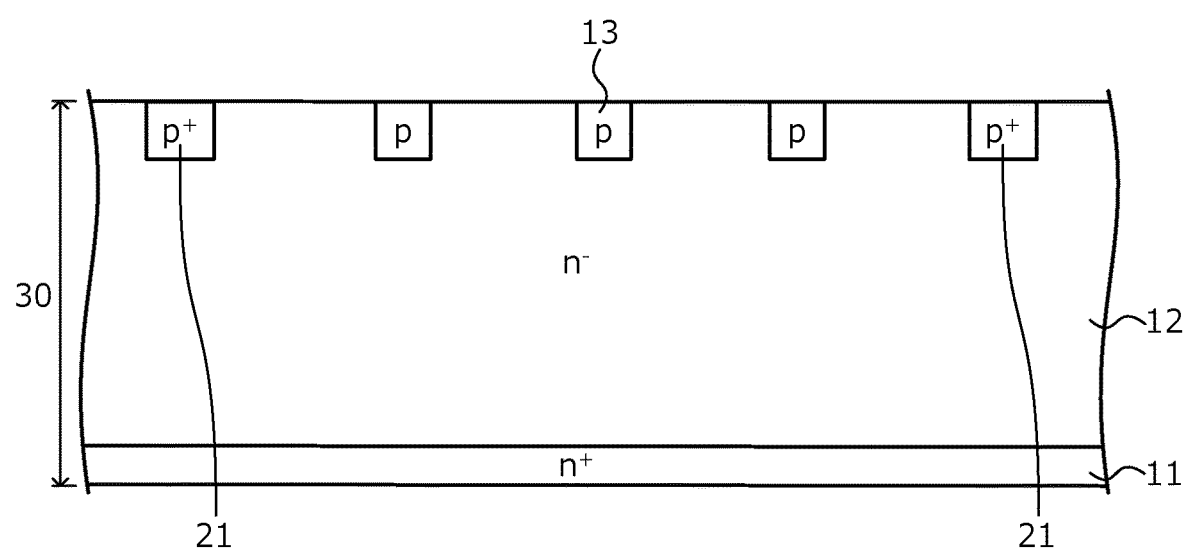
FIG. 8 is a cross-sectional view depicting a state of the silicon carbide semiconductor device according to the first embodiment during manufacture.

Next, as depicted in FIG. 8, by photolithography and the first ion implantation of a p-type impurity such as aluminum, in the active region 10 (refer to FIGS. 1 and 3), in surface regions of the semiconductor substrate 30 at the front surface thereof, at least one of the p-type regions 13 configuring the JBS structure, and the FLR 21 are each selectively formed (step S1 (part 1): second process). In FIG. 8, for simplification, a fewer number of the p-type regions 13 (here, 3) are depicted than in FIG. 1. The p-type regions 13 are disposed at equal intervals of, for example, about 2 µm in a direction parallel to the front surface of the semiconductor substrate 30.

Here, while the semiconductor substrate 30 is heated at a temperature of, for example, about 500 degrees C., the first ion implantation is performed to the n⁻-type epitaxial layer (the n⁻-type drift region 12), from the front surface of the semiconductor substrate 30. In the first ion implantation, for example, the ion implantation of the p-type impurity is divided into multiple stages performed using differing acceleration energies in a range from about 30 keV to 350 keV so that the impurity concentration distribution 13a from the front surface of the semiconductor substrate 30 to the depth d1 of 500 nm (refer to FIG. 5) becomes a box profile within an impurity concentration range of the p-type regions 13 described above.

Figure 9:
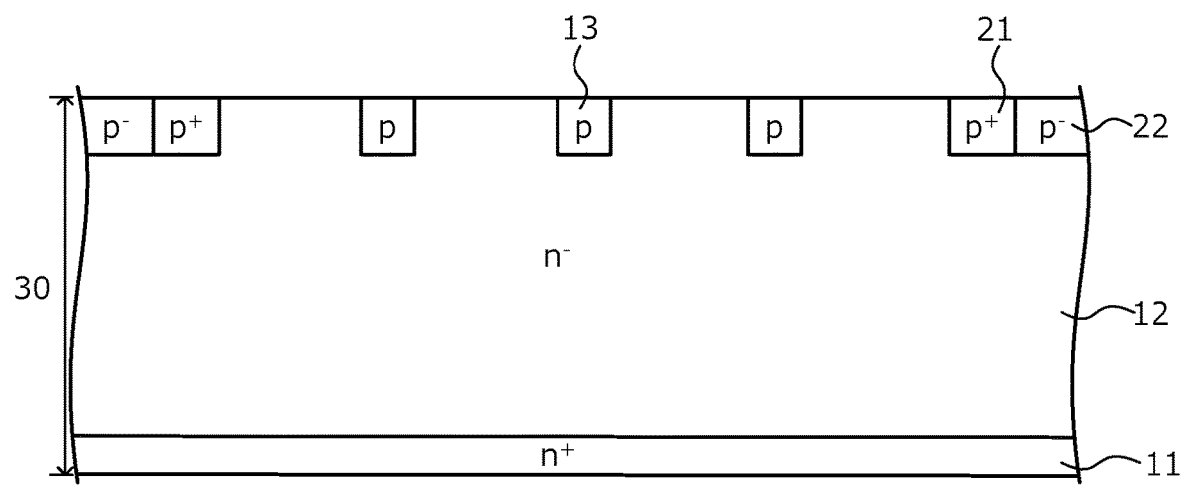
FIG. 9 is a cross-sectional view depicting a state of the silicon carbide semiconductor device according to the first embodiment during manufacture.

Next, as depicted in FIG. 9, a process including photolithography and a second ion implantation of an impurity as one set is repeatedly performed under different conditions, whereby in the edge termination region 20 (refer to FIG. 3), in surface region of the semiconductor substrate 30 at the front surface thereof, the p-type regions (the p⁻-type region 22 and the p⁻⁻-type region 23) configuring the JTE structure, and the n⁺-type channel stopper region 24 are each selectively formed (step S1 (part 2)). The second ion implantation, for example, similarly to the first ion implantation, is divided into and performed in multiple stages so that the impurity concentration distribution has a box profile.

Figure 10:
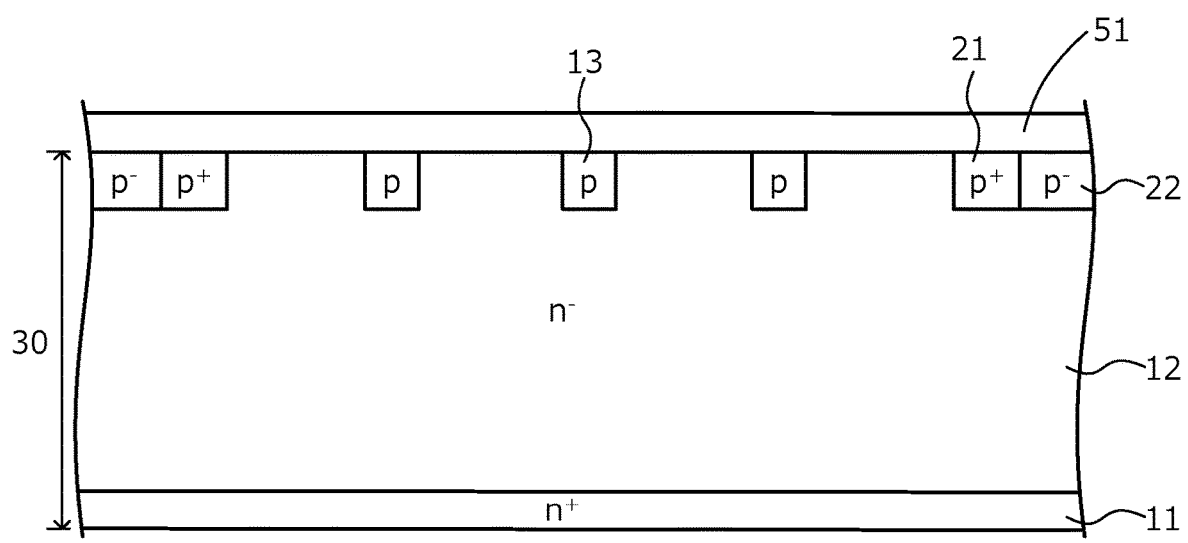
FIG. 10 is a cross-sectional view depicting a state of the silicon carbide semiconductor device according to the first embodiment during manufacture.

Next, as depicted in FIG. 10, after in an entire area of the front surface of the semiconductor substrate 30 is covered and protected by, for example, a carbon (C) protective film 51, the impurities implanted by the first and the second ion implantations are activated by a heat treatment (step S2). In the process at step S2, for example, the semiconductor substrate 30 is inserted in a treatment furnace of heat treatment equipment and after an atmosphere of the treatment furnace is suctioned (evacuated) to a pressure that is at most about 1×10⁻² Pa, argon (Ar) gas is introduced into the treatment furnace and under an atmosphere of a pressure of about 1×10⁵ Pa, a heat treatment of a temperature of about 1700 degrees C. is performed for about 5 minutes.

Figure 11:
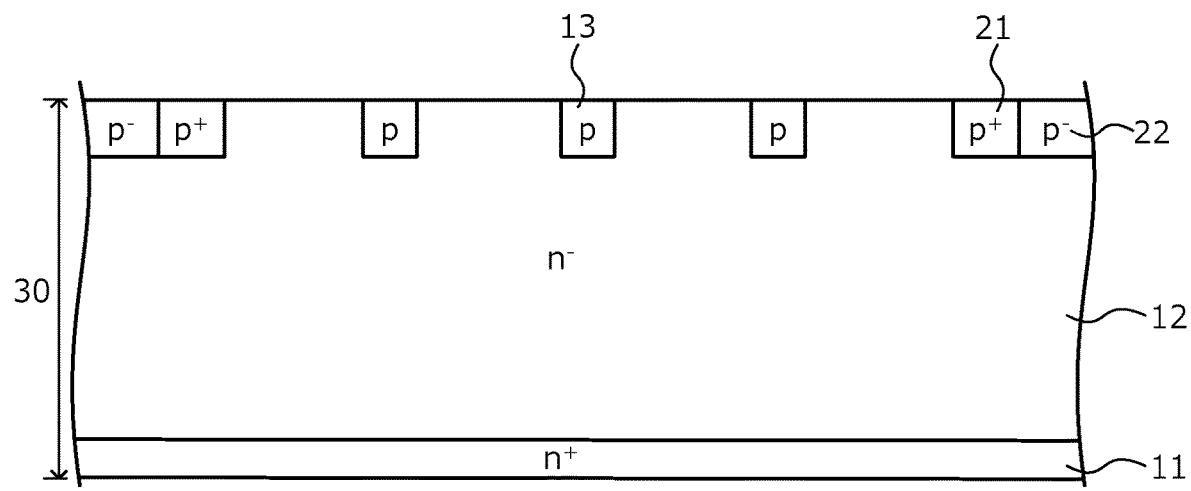
FIG. 11 is a cross-sectional view depicting a state of the silicon carbide semiconductor device according to the first embodiment during manufacture.

Next, as depicted in FIG. 11, the carbon protective film 51 is removed by ashing, for example, using ashing treatment (ashing) equipment. For example, reactive ion etching (RIE) equipment is used as the ashing equipment. After a treatment furnace of the RIE equipment is set to an oxygen (O₂) gas atmosphere at a pressure of about 6 Pa and high frequency (radio frequency (RF)) power of about 500 W is applied, plasmatizing the oxygen gas atmosphere, the carbon protective film 51 is removed by ashing for about 5 minutes under this atmosphere.

Figure 12:
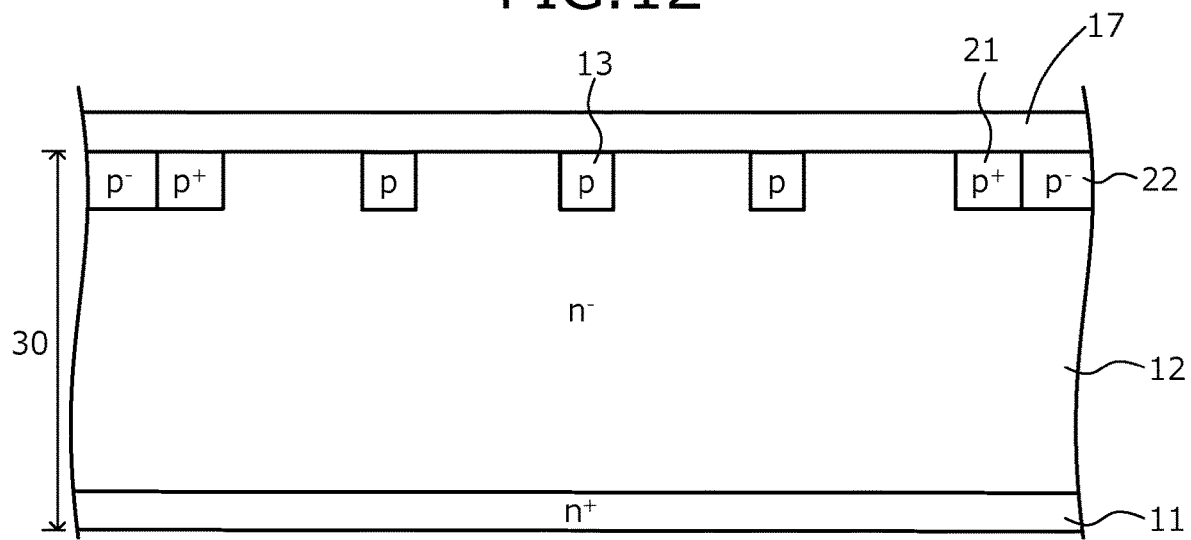
FIG. 12 is a cross-sectional view depicting a state of the silicon carbide semiconductor device according to the first embodiment during manufacture.
Figure 13:
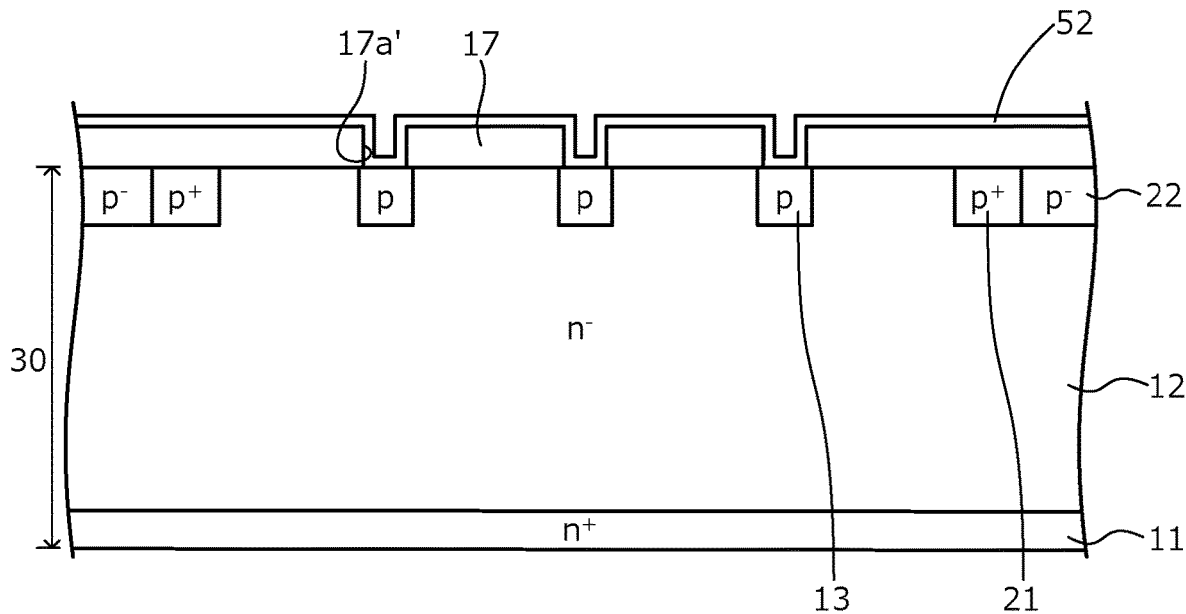
FIG. 13 is a cross-sectional view depicting a state of the silicon carbide semiconductor device according to the first embodiment during manufacture.

Next, as depicted in FIG. 12, for example, a thermal oxidation method and a chemical vapor deposition (CVD) method are sequentially performed, thereby forming in an entire area of the front surface of the semiconductor substrate 30, the interlayer insulating film 17 having a thickness of, for example, about 500 nm (step S3: third process). Next, as depicted in FIG. 13, the interlayer insulating film 17 is selectively removed by photolithography and etching, forming multiple openings 17a', and the p-type regions 13 are respectively exposed in the openings 17a' of the interlayer insulating film 17 (step S4: fourth process). Processing at step S4 may be performed by dry etching.

Figure 14:
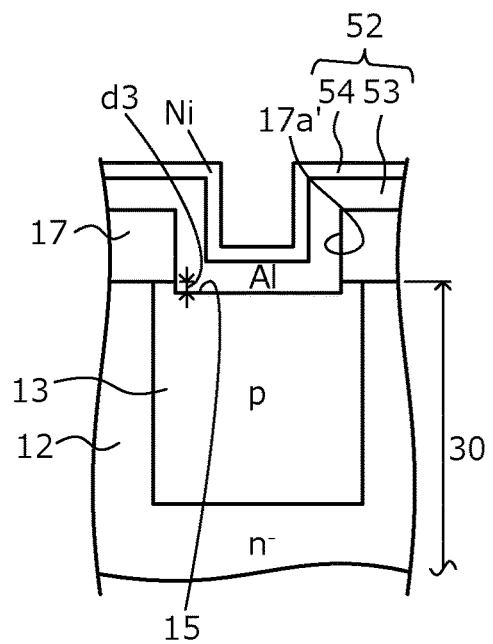
FIG. 14 is a cross-sectional view depicting a state of the silicon carbide semiconductor device according to the first embodiment during manufacture.

Dimensional accuracy of the width of the openings 17a' of the interlayer insulating film 17 may be increased by performing the processing at step S4 by dry etching, and the p-type regions 13 may each be exposed with dimensional accuracy. Over-etching occurs due to the processing at step S4 being performed by dry etching and therefore, in the openings 17a' of the interlayer insulating film 17, the front surface of the semiconductor substrate 30 may be slightly removed. As a result, at the front surface of the semiconductor substrate 30 in the openings 17a' of the interlayer insulating film 17, the recesses 15 of a width substantially equal to that of the openings 17a' of the interlayer insulating film 17 are formed to the depth d3 of, for example, about 30 nm (FIG. 14).

Next, as depicted in FIGS. 13 and 18, for example, along inner walls of the recesses 15 in the openings 17a' of the interlayer insulating film 17, the aluminum film 53 and a nickel film 54 are sequentially stacked on the interlayer insulating film 17 by sputtering (step S5: fifth process). In FIG. 13, the aluminum film 53 and the nickel film 54 are collectively depicted as a single layer referred to as a layered metal film 52. In FIG. 18, the p-type regions 13, the recesses 15, and the interlayer insulating film 17 are not depicted, only portions of the layered metal film 52 in contact with the semiconductor substrate 30 in the openings 17a' of the interlayer insulating film 17 are depicted (similarly in FIGS. 19 and 20).

The aluminum film 53 is a material film for forming the p⁺-type contact regions 14 by thermal diffusion of aluminum atoms in a heat treatment at step S6 described hereinafter. The aluminum film may contain an impurity such as silicon. The nickel film 54 is a cap film that prevents melting of the aluminum film 53 during the heat treatment at step S6 and, for example, has a thickness of about 50 nm. In an instance in which the aluminum film 53 melts due to the heat treatment at step S6, the aluminum film 53 becomes granulated and partially contacts the semiconductor substrate 30, whereby the p⁺-type contact regions 14 cannot be formed uniformly in an entire area of the bottoms of the recesses 15 and therefore, the cap film is used. Preferably, the cap film may be a metal that may be etched by wet etching and that has a high melting point. As such a material, other than nickel, titanium, molybdenum, etc. may be used.

While dependent on the temperature of the heat treatment at step S6, a thickness t1 of the aluminum film 53 may be, for example, in a range from about 50 nm to 150 nm, or may be preferably in a range from about 80 nm to 120 nm. In an instance in which the thickness t1 of the aluminum film 53 is less than 50 nm, nickel of the nickel film 54 and silicon of the semiconductor substrate 30 react with each other forming a nickel silicide, and similarly to the conventional structure (refer to FIGS. 29 and 30), excess carbon (C) precipitates, whereby step coverage defects of the titanium film 31 described hereinafter may occur.

An upper limit of the thickness t1 of the aluminum film 53, for example, may be determined according to the processing time of steps S5 and S7. A reason for this is as follows. The greater is the thickness t1 of the aluminum film 53, the longer is the processing time at step S5. In addition, the greater is the thickness t1 of the aluminum film 53, the thicker is a portion of the aluminum film 53 that is left unreacted with the semiconductor substrate 30 and the nickel film 54 by the heat treatment at step S6 (refer to FIG. 20) and therefore, the processing time at later-described step S7 increases.

Next, by a heat treatment, the layered metal film 52 is sintered (step S6: sixth process). By the heat treatment at step S6, as depicted in FIG. 19, silicon atoms in the semiconductor substrate 30 thermally diffuse into the aluminum film 53 (thermal diffusion 61). As depicted in FIG. 19, aluminum atoms in the aluminum film 53 thermally diffused into the semiconductor substrate 30 and the nickel film 54 (thermal diffusions 62, 63). As a result, as depicted in FIG. 20, the silicon atoms in the semiconductor substrate 30 thermally diffuse to vacancies in the aluminum film 53 (the thermal diffusion 61), whereby an aluminum silicon (AlSi) compound 55 is generated at contact portions of the aluminum film 53 in contact with the semiconductor substrate 30.

Figure 15:
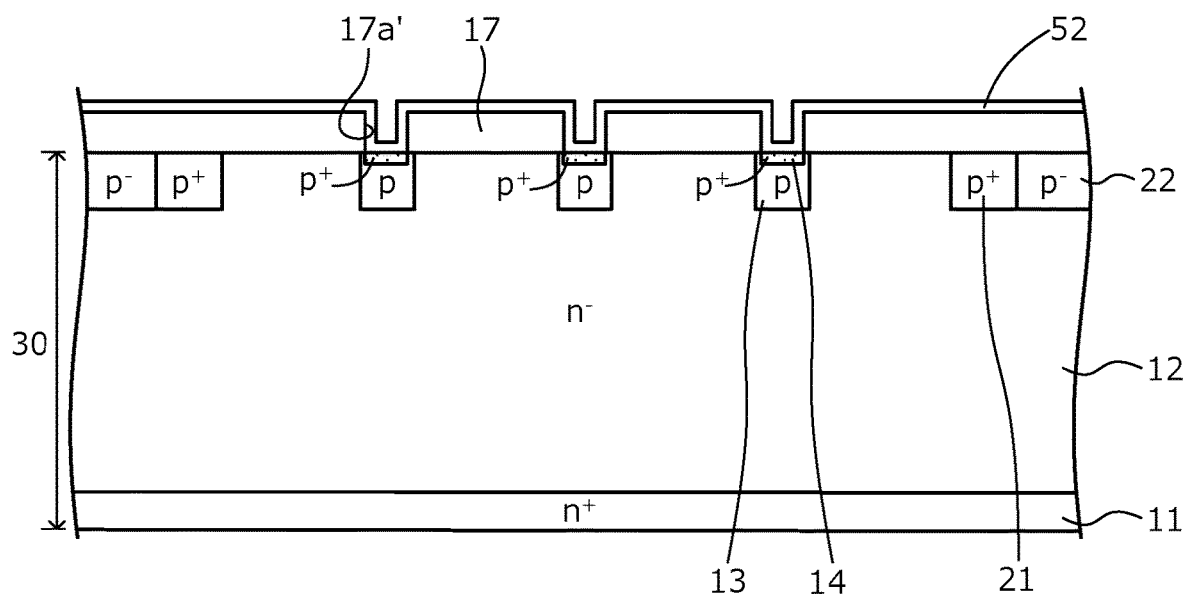
FIG. 15 is a cross-sectional view depicting a state of the silicon carbide semiconductor device according to the first embodiment during manufacture.

Further, as depicted in FIGS. 15 and 20, the aluminum atoms in the aluminum film 53 thermally diffuse into the semiconductor substrate 30 (the thermal diffusion 62), whereby at contact portions in contact with the aluminum film 53, in surface regions of the semiconductor substrate 30 at the front surface thereof, the p$^+$-type contact regions 14 are formed by self-alignment. Aluminum atoms are less likely to be thermally diffused in any direction in the semiconductor substrate 30 containing silicon carbide and therefore, in surface regions of the p-type regions 13 at the depth d3 that is shallow, the p$^+$-type contact regions 14 are formed in which the aluminum atoms thermally diffused from the aluminum film 53 (the thermal diffusion 62) are introduced at a high impurity concentration. Further, the p$^+$-type contact regions 14 are free of nickel that is an element contained in the cap film.

Further, as depicted in FIG. 20, the aluminum atoms in the aluminum film 53 are thermally diffused into the nickel film 5 (the thermal diffusion 63), whereby a nickel aluminum (NiAl) compound 56 is generated at contact portions of the nickel film 54 in contact with the aluminum film 53. The compounds 55, 56 generated by the heat treatment at step S6 and the aluminum film 53 left between these compounds 55, 56 may be removed by a predetermined solution and therefore, may be removed in a subsequent process or may be left in the silicon carbide semiconductor device 40 as a product.

Further, as depicted in FIG. 19, while nickel atoms in the nickel film 54 are also thermally diffused into the aluminum film 53 (thermal diffusion 64), the thickness t1 of the aluminum film 53 is set to be thick in the range described above, whereby the semiconductor substrate 30 and the nickel film 54 may be separate from each to an extent that the nickel atoms thermally diffused from the nickel film 54 (the thermal diffusion 64) and the silicon atoms thermally diffused from the semiconductor substrate 30 (the thermal diffusion 61) do not react with each other. In other words, in the process at step S6, a compound containing the nickel atoms in the nickel film 54 and the silicon atoms in the semiconductor substrate 30 is not formed.

On the other hand, in an instance in which the thickness t1 of the aluminum film 53 is thin and less than the range described above, in the heat treatment at step S6, the p$^+$-type contact regions 14 cannot be formed. A reason for this is as follows. As depicted in FIG. 21, in the reference example, in the heat treatment at step S6, as a material film for forming the p$^+$-type contact regions 14, a thickness t1' of an aluminum film 53' deposited on the front surface of the semiconductor substrate 30 is thin and less than the lower limit of the range of the thickness t1 of the aluminum film 53 of the present first embodiment described above.

In the reference example as well, in the heat treatment at step S6, the semiconductor substrate 30, thermal diffusions 61', 62', 63', and 64' between the aluminum film 53' and a nickel film 54' occur similarly as in the first embodiment. In other words, as depicted in FIG. 22, the silicon atoms in the semiconductor substrate 30 thermally diffuse into the aluminum film 53' (the thermal diffusion 61'). Aluminum atoms in the aluminum film 53' thermally diffuse into the semiconductor substrate 30 and into the nickel film 54' (the thermal diffusions 62' and 63'). Nickel atoms in the nickel film 54' thermally diffuse into the aluminum film 53' (the thermal diffusion 64').

By the thermal diffusions 61', 64' of the silicon atoms and the nickel atoms into the aluminum film 53', as depicted in FIG. 23, on the front surface of the semiconductor substrate 30, an aluminum-nickel-silicon (Al—Ni—Si) compound 55' is generated, and excess carbon in the semiconductor substrate 30 (indicated as "precipitated C" in FIG. 23) precipitates. In the aluminum-nickel-silicon compound 55', a nickel silicide is formed by a high-temperature heat treatment at step S8 described hereinafter, forming a low-resistance ohmic contact with the semiconductor substrate 30.

In this manner, in the reference example, the aluminum-nickel-silicon compound 55' is generated by the nickel atoms in the nickel film 54' and the silicon atoms in the semiconductor substrate 30 and therefore, the p$^+$-type contact regions 14 are not formed. Further, the aluminum-nickel-silicon compound 55' is generated extending into the semiconductor substrate 30 and therefore, cannot be removed by a subsequent process at step S7. Reference numeral 56' is a nickel-aluminum compound generated by the heat treatment at step S6 and may be removed similarly to the nickel aluminum compound 56 of the first embodiment.

The temperature of the heat treatment at step S6 may be preferably, for example, in a range from about 600 degrees C. to 700 degrees C. A reason for this is as follows. When the temperature of the heat treatment at step S6 exceeds 700 degrees C., the nickel aluminum compound 56 and the interlayer insulating film 17 that is a silicon oxide (SiO$_2$) film react with each other, generating a compound from nickel, silicon, oxygen, and aluminum. This compound containing nickel, silicon, oxygen, and aluminum causes leak defects during reverse bias.

When the temperature of the heat treatment at step S6 is less than 600 degrees C., the aluminum atoms in the aluminum film 53 are not thermally diffused into the semiconductor substrate 30 (the thermal diffusion 62). The layered metal film 52 may be removed using a predetermined solution and is completely removed in a process at step S7 described hereinafter. Therefore, in a process at step S6 and subsequent processes, even when a heat treatment is of a temperature higher than the temperature of the heat treatment at step S6 is performed, the p$^+$-type contact regions 14 are not formed and ohmic contact with the titanium film 31 is not obtained.

Figure 16:
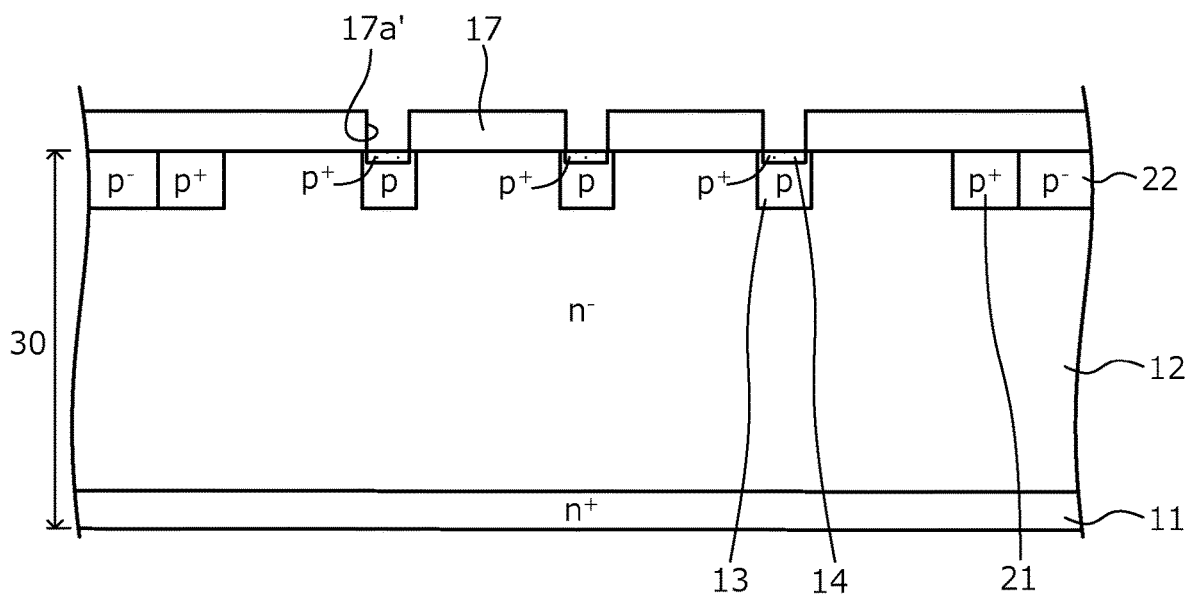
FIG. 16 is a cross-sectional view depicting a state of the silicon carbide semiconductor device according to the first embodiment during manufacture.

Next, as depicted in FIG. 16, excess metal film left on the interlayer insulating film 17 and in the openings 17a' of the interlayer insulating film 17 is removed (step S7: seventh process). The excess metal film is the aluminum-silicon compound 55, the nickel aluminum compound 56, and the aluminum film 53 that is left after the heat treatment at step S6. In the process at step S7, for example, wet etching using a mixed solution of phosphoric acid (H$_3$PO$_4$), nitric acid (HNO$_3$), and acetic acid (C$_2$H$_4$O$_2$) may be performed. The aluminum-silicon compound 55 may be left on the front surface of the semiconductor substrate 30.

Next, for example, by a heat treatment at temperature of about 1000 degrees C., the semiconductor substrate 30 is annealed (step S8). The aluminum atoms thermally diffused into the semiconductor substrate 30 (the thermal diffusion 62) during the heat treatment at step S6 are activated by the heat treatment at step S8. Next, as depicted in FIG. 17, the contact hole 17a and a contact hole 17b (refer to FIG. 3) each penetrating the interlayer insulating film 17 in the depth direction are formed by photolithography and etching, and the interlayer insulating film 17 is left so as to cover only the front surface of the semiconductor substrate 30 in the edge termination region 20 (step S9: eight process).

In the process at step S9, all portions of the interlayer insulating film 17 inward from near the border between the active region 10 and the edge termination region 20 is removed, forming the contact hole 17a, and in the contact hole 17a, substantially an entire area of the front surface of the semiconductor substrate 30 in the active region 10 is exposed. The portions of the interlayer insulating film 17 inward from near the border between the active region 10 and the edge termination region 20 are portions used as a mask covering portions other than the p-type regions 13 during formation of the p$^+$-type contact regions 14.

In the contact hole 17a, all of the p$^+$-type contact regions 14, portions of the n$^-$-type drift region 12 between adjacent p$^+$-type contact regions 14 of the p$^+$-type contact regions 14, and a portion of the FLR 21 are exposed. In an instance in which the width w2 of the p$^+$-type contact regions 14 is less than the width w1 of the p-type regions 13, in the contact hole 17a, portions of the p-type regions 13 sandwiched between the p$^+$-type contact regions 14 and the n$^-$-type drift region 12 are also exposed. In the contact hole 17b, the n$^+$-type channel stopper region 24 is exposed.

Figure 17:
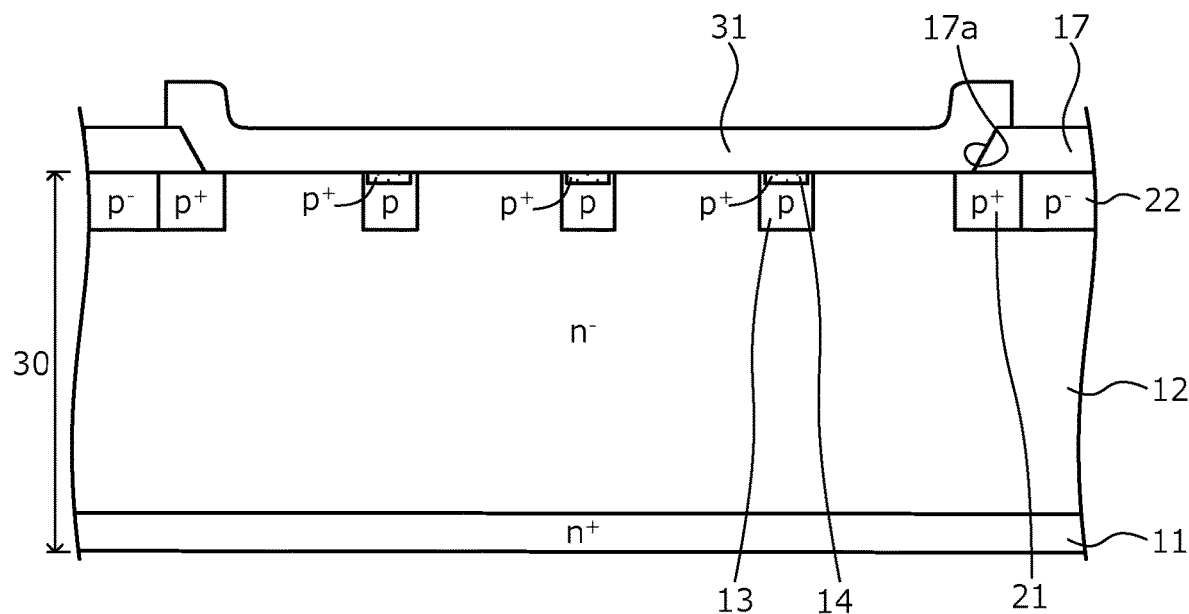
FIG. 17 is a cross-sectional view depicting a state of the silicon carbide semiconductor device according to the first embodiment during manufacture.

Next, as depicted in FIG. 17, for example, by physical vapor deposition (PVD) such as sputtering, from the surface of the interlayer insulating film 17, the titanium film 31 is formed in an entire area of the front surface of the semiconductor substrate 30 in the contact hole 17a. Next, the titanium film 31 is left in only in the contact hole 17a by photolithography and etching (step S10: ninth process). The titanium film 31 may extend on the interlayer insulating film 17 from the contact hole 17a.

Next, the titanium film 31 is sintered by a heat treatment of, for example, a temperature of about 500 degrees C. for about 10 minutes (step S11). By the heat treatment at step S11, the Schottky junctions between the titanium film 31 and the n$^-$-type drift region 12 are formed, and ohmic contact between the titanium film 31 and the p$^+$-type contact regions 14 is formed. In other words, the titanium film 31 serves as the Schottky electrodes forming Schottky junctions with the n$^-$-type drift region 12 and serves as the ohmic electrodes in ohmic contact with the p$^+$-type contact regions 14.

In an instance in which the aluminum-silicon compound 55 is left on the front surface of the semiconductor substrate 30 in the contact hole 17a by the process at step S7 described above, the titanium film 31 is formed on the aluminum-silicon compound 55. In this instance, by the heat treatment at step S11, ohmic contact is formed between the p$^+$-type contact regions 14 and the compound that is generated by the aluminum-silicon compound 55 reacting with the titanium atoms thermally diffused into the aluminum-silicon compound 55 from the titanium film 31.

Next, for example, by physical vapor deposition such as sputtering, the aluminum alloy film of a thickness of, for example, about 5 μm is formed from the surface of the titanium film 31, to the surface of the interlayer insulating film 17 and in an entire area of the front surface of the semiconductor substrate 30 in the contact hole 17b (the ninth process). Next, by photolithography and etching, the aluminum alloy film is selectively removed to be left on the surface of the titanium film 31 as the aluminum alloy film 32 constituting the front electrode 16 and to be left in the contact hole 17b as the channel stopper electrode 25.

Next, the semiconductor substrate 30 is ground from the back surface thereof, to a position corresponding to a product thickness used for the silicon carbide semiconductor device 40. Next, for example, by physical vapor deposition such as sputtering, the back electrode 19 is formed in an entire area of the back surface of the semiconductor substrate 30 (back surface of the n$^+$-type starting substrate 11) (tenth process). Thereafter, the semiconductor wafer is diced (cut) into individual chips, whereby the silicon carbide semiconductor device 40 depicted in FIGS. 1, 3, and 4 is completed.

Figure 24:
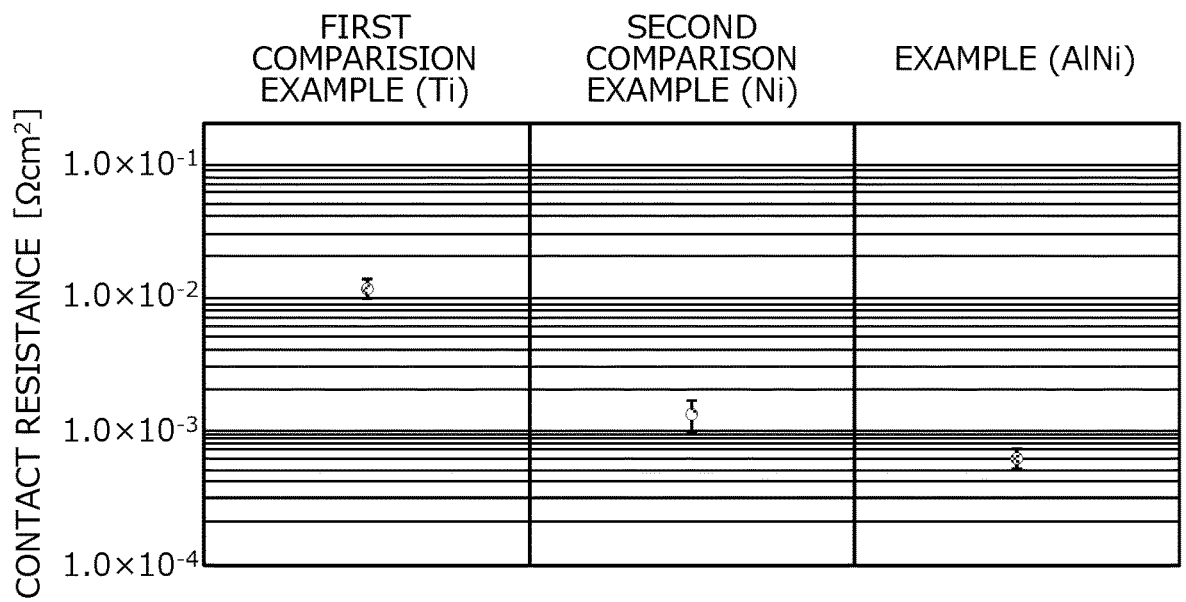
FIG. 24 is a characteristics diagram of contact resistance characteristics of an example.

Next, contact resistance of the silicon carbide semiconductor device 40 according to the first embodiment was verified. FIG. 24 is a characteristics diagram of contact resistance characteristics of an example. According to the method of manufacturing the silicon carbide semiconductor device 40 according to the first embodiment described above, a silicon carbide diode having the p$^+$-type contact regions 14 in ohmic contact with the titanium film 31 functioning as the Schottky electrodes was fabricated (hereinafter, "example"). Results of measurement of the contact resistance of the example are depicted in FIG. 24.

Further, FIG. 24 shows measurement results for contact resistance of first and second comparison examples. The first comparison example differs from the example in that in the method of manufacturing the silicon carbide semiconductor device 40 according to the first embodiment described above, the processes at steps S4 to S8 are not performed. In FIG. 24, titanium (Ti) indicated in the parenthesis for the first comparison example is a material of the Schottky electrodes of the first comparison example. The second comparison example differs from the example in that in the method of manufacturing the silicon carbide semiconductor device 40 according to the first embodiment described above, only the nickel film 54 is deposited in the process at step S5.

From the results depicted in FIG. 24, it was confirmed that the example had lower contact resistance as compared to the first comparison example for which the heat treatments at steps S4 to S8 were not performed and the second comparison example for which the aluminum film 53 was not used as a material in the heat treatment at step S6. In the example, it is presumed that in the process at step S6, ohmic contact is formed between the titanium film 31 functioning as Schottky electrodes and the p$^+$-type contact regions 14 formed by the thermal diffusion of aluminum atoms from the aluminum film 53, whereby the contact resistance may be reduced.

Figure 25:
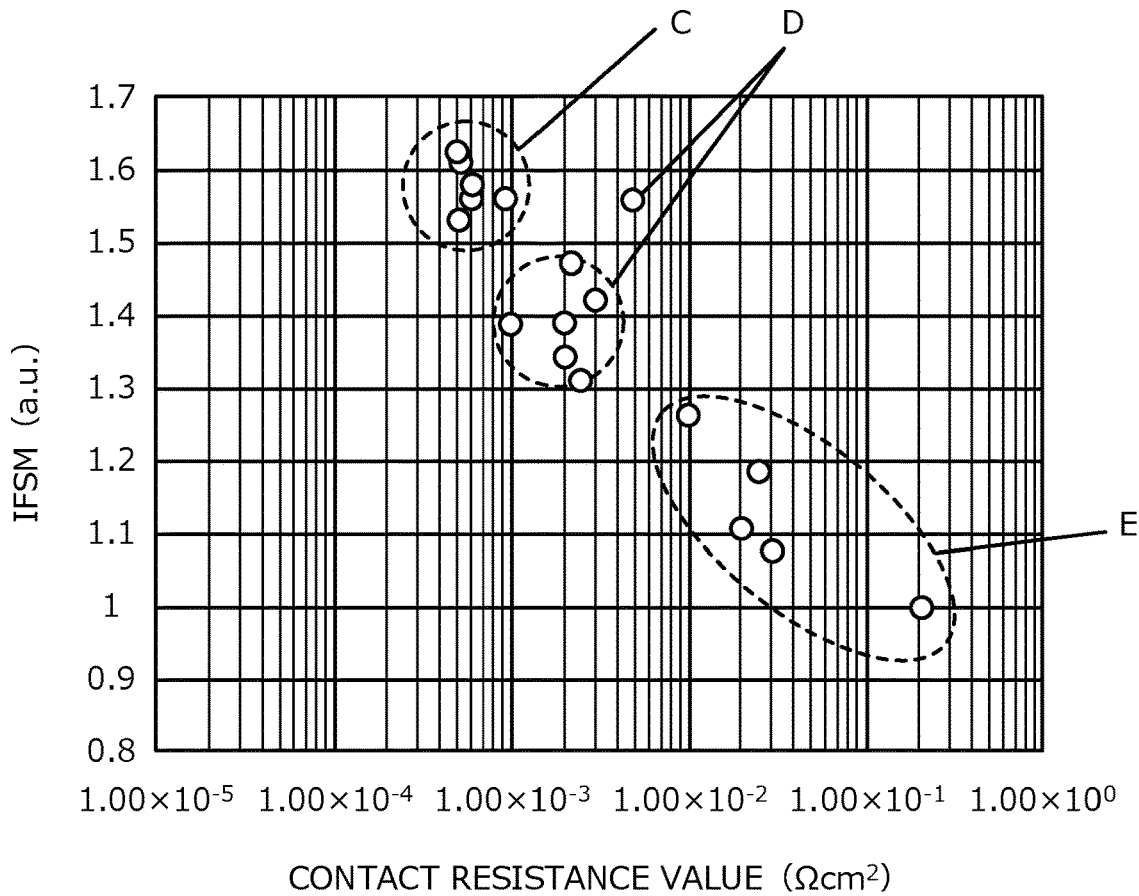
FIG. 25 is a characteristics diagram depicting a relationship between contact resistance and surge current withstand amount of the example.

Next, a relationship between contact resistance and surge current (IFSM) capability of the silicon carbide semiconductor device 40 according to the first embodiment was verified. FIG. 25 is a characteristics diagram depicting the relationship between contact resistance and surge current withstand amount of the example. A measured point set C indicating a relationship between contact resistance and the surge current withstand amount of the example described above is shown in FIG. 25.

The surge current withstand amount of the measured point set C of the example is shown as a ratio with the surge current withstand amount of a measured point set D of a conventional example as 1. The measured point set D of the conventional example is a set of measured points of a silicon carbide diode having a conventional structure having the nickel silicide film 131 constituting ohmic electrodes (refer to FIGS. 29 and 30). A measured point set E of the conventional example is a set of measured points of a silicon carbide diode (not depicted) having a conventional structure without a nickel silicide film constituting ohmic electrodes. In FIG. 25, the measured point sets D, E showing relationships of contact resistance and the surge current withstand amount of the conventional examples are also shown.

From the results depicted in FIG. 25, it was confirmed that in the example, even without the nickel silicide film in ohmic contact with the semiconductor substrate 30, as compared to the conventional example having the nickel silicide film 131, a high surge current withstand amount and a low contact resistance may be obtained. A reason for this is presumed to be that, in the example, in the process at step S6, the p$^+$-type contact regions 14 formed by the thermal diffusion of aluminum atoms from the aluminum film 53 are in ohmic contact with the titanium film 31.

Figure 26:
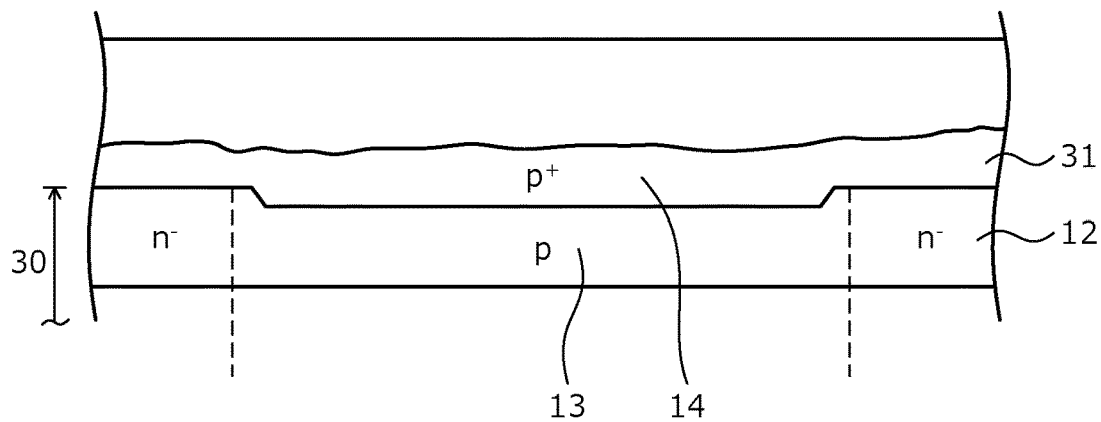
FIG. 26 is a cross-sectional view schematically depicting a state observed near an ohmic contact of the example.

FIG. 26 is a cross-sectional view schematically depicting a state observed near an ohmic contact of the example. FIG. 26 schematically depicts a state near an interface between the titanium film 31 and the p$^+$-type contact regions 14 of the example, observed using a scanning electron microscope (SEM).

From the results depicted in FIG. 26, it was confirmed that in the example, no nickel silicide film is present between the titanium film 31 and the semiconductor substrate 30. Therefore, it was found that in the example, problems caused by the excess carbon 131a that precipitates when the nickel silicide film 131 is formed in the conventional structure do not occur.

As described above, according to the first embodiment, multiple openings are formed in the interlayer insulating film that is formed so as to cover an entire area of the front surface of the semiconductor substrate, and in the openings of the interlayer insulating film, the p-type regions configuring the JBS structure are exposed. Further, in the openings of the interlayer insulating film, the aluminum film and the nickel film are sequentially stacked so as to be in contact with the front surface of the semiconductor substrate and thereafter, aluminum atoms in the aluminum film are thermally diffused into the semiconductor substrate by a heat treatment. As a result, by self-alignment, the p$^+$-type contact regions may be formed only in surface regions of the p-type regions configuring the JBS structure.

By the p$^+$-type contact regions, ohmic contact of sufficiently low resistance is formed with the titanium film that functions as the Schottky electrodes and therefore, the ohmic property between the titanium film and the p-type regions configuring the JBS structure may be enhanced, and the surge current withstand amount may be enhanced. Further, according to the first embodiment, during formation of the p$^+$-type contact regions, no silicide is generated and therefore, no precipitation of excess carbon occurs. Moreover, the layered metal film used as a material in the formation of the p$^+$-type contact regions is removed before the formation of the front electrode. Accordingly, the front electrode may be formed with favorable step-coverage on the front surface of the semiconductor substrate.

Further, according to the first embodiment, the p$^+$-type contact regions may be formed by self-alignment in only surface regions of the p-type regions configuring the JBS structure and therefore, the Schottky junctions with the titanium film may be formed in an entire area of the surface of portions of the n$^-$-type drift region between adjacent p-type regions of the p-type regions configuring the JBS structure. As a result, at the semiconductor chip surface, a lowest feasible forward voltage may be realized by an entire bonded surface area between the n$^-$-type drift region and the titanium film. Therefore, low forward voltage may be sustained by the SBD structure and the surge current withstand amount may be enhanced by the p$^+$-type contact regions of the surface regions of the p-type regions configuring the JBS structure.

Further, according to the first embodiment, the p$^+$-type contact regions are formed by the thermal diffusion of aluminum atoms from the aluminum film and therefore, as compared to an instance in which the p$^+$-type contact regions are formed by ion implantation, manufacturing time may be significantly reduced, which is useful for mass production of the silicon carbide semiconductor device. Further, the p$^+$-type contact regions are not formed by ion implantation and therefore, surface roughness at the front surface of the semiconductor substrate does not occur due to ion implantation. Surface roughness is a state in which unevenness of at least 0.2 nm occurs as a measurement of average surface roughness (Ra) by an atomic force microscope (AFM).

Figure 27:
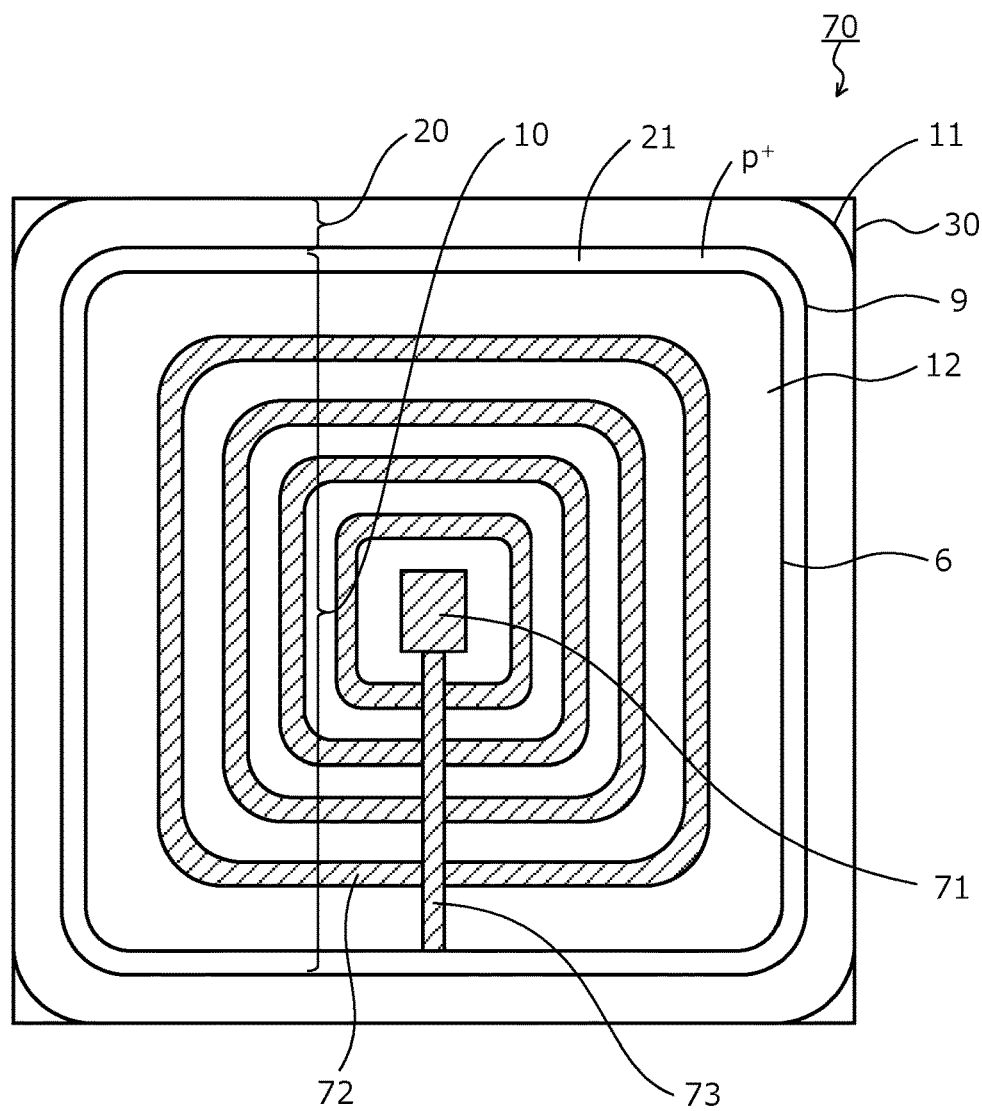
FIG. 27 is a plan view of an example of a layout of a silicon carbide semiconductor device according to a second embodiment when viewed from a front side of a semiconductor substrate.
Figure 28:
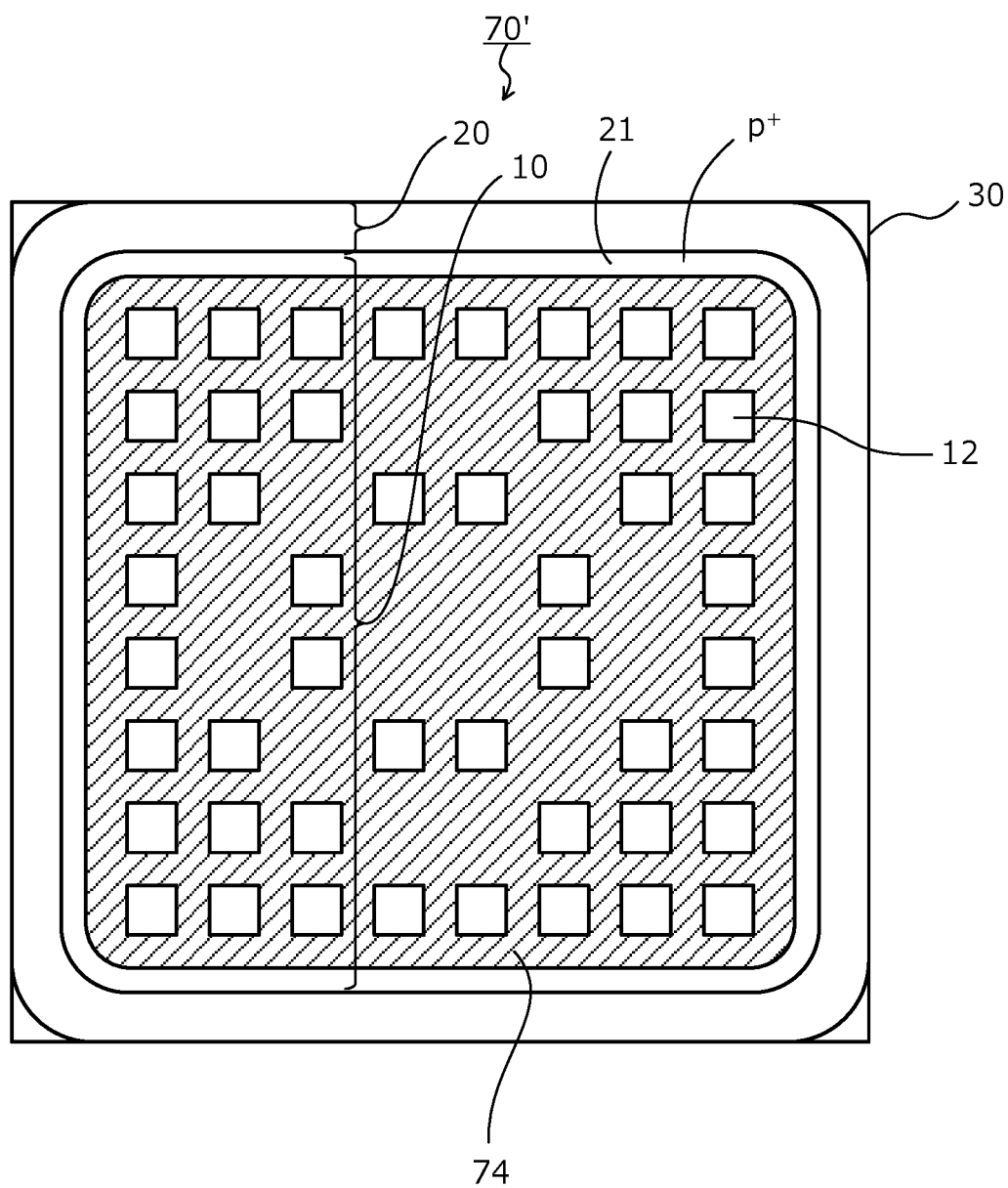
FIG. 28 is a plan view of an example of a layout of the silicon carbide semiconductor device according to the second embodiment when viewed from the front side of the semiconductor substrate.

Next, a structure of a silicon carbide semiconductor device according to a second embodiment is described. FIGS. 27 and 28 are plan views of examples of layouts of the silicon carbide semiconductor device according to the second embodiment when viewed from the front side of the semiconductor substrate. In FIGS. 27 and 28, p-type regions 72, 74 are indicated by hatching, respectively.

In silicon carbide semiconductor devices 70, 70' according to the second embodiment, layouts of the p-type regions 72, 74 configuring the JBS structure when viewed from the front surface of the semiconductor substrate (semiconductor chip) 30 differ from the layout of the silicon carbide semiconductor device 40 according to the first embodiment. Between the front electrode (not depicted, corresponds to reference numeral 16 in FIG. 3) and the p-type regions 72, 74, similarly to the first embodiment, the p$^+$-type contact regions (not depicted, corresponds to reference numeral 14 in FIG. 3) in ohmic contact with a titanium film (not depicted, corresponds to reference numeral 31 in FIG. 3) that is the lowermost layer of the front electrode are disposed.

Therefore, while not depicted, a layout of the p$^+$-type contact regions that are in ohmic contact with the titanium film that is the lowermost layer of the front electrode is the same as that of the p-type regions 72, 73. In the second embodiment, for the p$^+$-type contact regions that are in ohmic contact with the titanium film that is the lowermost layer of the front electrode, the surface area of portions bonded to the titanium film is greatest directly beneath a connection portion between the front electrode and a wire (not depicted, corresponds to reference numeral 42 in FIG. 2) and the surface area of portions bonded to the titanium film decreases with increasing distance of the disposal position thereof from the connection portion between the front electrode and the wire.

In particular, in the silicon carbide semiconductor device 70 according to the second embodiment depicted in FIG. 27, for example, directly beneath the connection portion between the front electrode and the wire (center of the active region 10), the p-type region 71 is disposed in a substantially rectangular shape in a plan view. The p-type regions 72 configuring the JBS structure are disposed in plural in a substantially rectangular concentric pattern surrounding the p-type region 71 and centered around the center of the active region 10, in a plan view. All of the p-type regions 72, for example, are electrically connected by a p-type region 73 that extends in a substantially linear shape from the p-type region 71 and reaches the FLR 21, in a direction parallel to the front surface of the semiconductor substrate 30.

Between the front surface of the semiconductor substrate 30 and the p-type regions 71 to 73, the p$^+$-type contact regions are disposed in contact with the p-type regions 71 to 73, in layouts and planar shapes similar to those of the p-type regions 71 to 73. The p$^+$-type contact regions, similarly to the first embodiment, form ohmic contacts with the titanium film that is the lowermost layer of the front electrode. Further, portions of the n$^-$-type drift region 12 in the p$^+$-type contact regions, similarly to the first embodiment, form Schottky junctions with the titanium film that is the lowermost layer of the front electrode.

In the silicon carbide semiconductor device 70' according to the second embodiment depicted in FIG. 28, portions of the n⁻-type drift region 12 in the active region 10, for example, are exposed at the front surface of the semiconductor substrate 30 in substantially rectangular shapes separate from one another. The portions of the n⁻-type drift region 12 exposed at the front surface of the semiconductor substrate 30 (hereinafter, exposed portions of the n⁻-type drift region 12) are not disposed directly beneath a connection portion between the bonding pad and the aluminum wire. The exposed portions of the n⁻-type drift region 12 are disposed more densely with increasing distance from the connection portion between the bonding pad and the aluminum wire. The exposed portions of the n⁻-type drift region 12, similarly to the first embodiment, form Schottky junctions with the titanium film that is the lowermost layer of the front electrode.

A p-type region 74 configuring the JBS structure is disposed in an entire area of the front surface of the semiconductor substrate 30 in the active region 10 so as to surround peripheries of the exposed portions of the n⁻-type drift region 12. An outer periphery of the p-type region 74 may be in contact with the FLR 21. While not depicted, between the p-type region 74 configuring the JBS structure and the front surface of the semiconductor substrate 30, similarly to the first embodiment, a p⁺-type contact region (not depicted, corresponds to reference 14 in FIG. 3) is disposed in contact with the p-type region 74, in a layout and a planar shape similar to the layout and the planar shape of the p-type region 74. The p⁺-type contact region, similarly to the first embodiment, forms an ohmic contact with the titanium film that configures the front electrode.

A method of manufacturing the silicon carbide semiconductor devices 70, 70' according to the second embodiment is similar to the method of manufacturing the silicon carbide semiconductor device 40 according to the first embodiment (refer to FIGS. 6 to 20). Therefore, even in an instance in which the p⁺-type contact regions that configure ohmic contacts with the titanium film that configures the front electrode are disposed in a fine pattern on the semiconductor substrate 30, similarly to the first embodiment, the p⁺-type contact regions may be formed by self-alignment in the openings formed by dry etching in the interlayer insulating film.

As described above, according to the second embodiment, effects similar to those of the first embodiment may be obtained. Further, in general, current density is greatest directly beneath the connection portion between the bonding pad and the aluminum wire and generated heat tends to increase. According to the second embodiment, the p⁺-type contact regions are disposed directly beneath the connection portions between the bonding pad and the aluminum wire, whereby directly beneath the connection portion between the bonding pad and the aluminum wire, the surface area of the ohmic contact between the front electrode and the p⁺-type contact regions increases. As a result, the surge current withstand amount at portions where the current density is greatest may be increased and the surge current withstand amount of the entire semiconductor chip may be enhanced.

Further, according to the second embodiment, with increasing proximity to the ends of semiconductor substrate, the surface area of the ohmic contact between the front electrode and the p⁺-type contact regions decreases. Therefore, even when the surface area of the ohmic contact directly beneath the connection portion between the bonding pad and the aluminum wire is increased and the surge current withstand amount is enhanced, the area of the Schottky junctions in the entire semiconductor chip may be maintained, and the forward voltage of the entire semiconductor chip may be maintained. Accordingly, for the silicon carbide diode having the JBS structure having a mixture of Schottky junctions and pn junctions on the front side of the semiconductor substrate 130, a predetermined low forward voltage is maintained, and the surge current withstand amount may be enhanced.

In the foregoing, without limitation to the described embodiments, the present invention may be variously modified within a range not departing from the spirit of the invention.

According to the invention described above, the second-conductivity-type high-concentration regions may be formed by self-alignment in only surface regions of the second-conductivity-type regions configuring the JBS structure and Schottky junctions may be formed with the titanium film in an entire area of the surface of portions of the first-conductivity-type region between adjacent p-type regions of the p-type regions configuring the JBS structure. Further, by the p⁺-type contact regions in the surface regions of the second-conductivity-type regions configuring the JBS structure, the ohmic property between the titanium film and the second-conductivity-type regions configuring the JBS structure may be enhanced.

The silicon carbide semiconductor device and the method of manufacturing a silicon carbide semiconductor device according to the present invention achieve an effect in that in a silicon carbide diode having a JBS structure having a mixture of Schottky junctions and pn junctions, low forward voltage may be maintained by the SBD structure and the surge current withstand amount may be enhanced.

As described above, the silicon carbide semiconductor device and the method of manufacturing a silicon carbide semiconductor device according to the present invention are useful for power semiconductor devices used in power converting equipment, power source devices of various industrial machines, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A method of manufacturing a silicon carbide semiconductor device, the method comprising:
    forming a first-conductivity-type region in a semiconductor substrate containing silicon carbide, a surface of the first-conductivity-type region constituting a first main surface of the semiconductor substrate, a second main surface of the semiconductor substrate being opposite to the first main surface thereof;
    selectively forming a plurality of second-conductivity-type regions in the first-conductivity-type region, at the first main surface of the semiconductor substrate;
    forming, on the first main surface of the semiconductor substrate, an interlayer insulating film covering the first-conductivity-type region and the second-conductivity-type regions;
    selectively removing the interlayer insulating film to form a plurality of openings exposing the second-conductivity-type regions;

forming, in each of the openings of the interlayer insulating film, a layered metal film, to thereby have an aluminum film in contact with the first main surface of the semiconductor substrate and a cap film stacked on the aluminum film to cover the aluminum film;

thermally diffusing aluminum atoms in the aluminum film, from a contact portion between the aluminum film and the semiconductor substrate, to the second-conductivity-type regions by a heat treatment, to thereby form a plurality of second-conductivity-type high-concentration regions, each second-conductivity-type high-concentration region being formed in a surface region of one of the second-conductivity-type regions, and having an impurity concentration higher than an impurity concentration of said one second-conductivity-type regions;

removing the layered metal film after forming the second-conductivity-type high-concentration regions;

selectively removing the interlayer insulating film to form a contact hole, after removing the layered metal film;

forming a first electrode by sequentially stacking a titanium film and a metal film containing aluminum on the first surface of the semiconductor substrate in the contact hole, the titanium film being in contact with the first-conductivity-type region and forming Schottky junctions with the first-conductivity-type region, the titanium film being in contact with the second-conductivity-type high-concentration regions and forming ohmic contacts with the second-conductivity-type high-concentration regions; and forming a second electrode on the second main surface of the semiconductor substrate.

2. The method according to claim 1, wherein
in forming the openings, the interlayer insulating film is selectively removed by dry etching.

3. The method according to claim 1, wherein
in forming the layered metal, a thickness of the aluminum film is in a range from 50 nm to 150 nm.

4. The method according to claim 3, wherein
the thickness of the aluminum film is in a range from 80 nm to 120 nm.

5. The method according to claim 1, wherein
in selectively forming the second-conductivity-type regions, the impurity concentration of each of the second-conductivity-type regions is in a range from $1\times10^{18}/cm^3$ to $2\times10^{19}/cm^3$, and
in forming the second-conductivity-type high-concentration regions, the impurity concentration of each of the second-conductivity-type high-concentration regions is at least $3\times10^{20}/cm^3$.

6. The method according to claim 1, wherein
the cap film contains any one of nickel, titanium, and molybdenum.

7. The method according to claim 1, wherein
in forming the second-conductivity-type high-concentration regions, the second-conductivity-type high-concentration regions are free of any element contained in the cap film.

8. A silicon carbide semiconductor device, comprising:
a semiconductor substrate containing silicon carbide, the semiconductor substrate having a first main surface and a second main surface opposite to each other;
a first-conductivity-type region provided in the semiconductor substrate so as to have a surface thereof exposed at the first main surface of the semiconductor substrate;
a plurality of second-conductivity-type regions selectively provided in the first-conductivity-type region at the first main surface of the semiconductor substrate, each in contact with the first-conductivity-type region;
a plurality of second-conductivity-type high-concentration regions provided respectively in and contacting the plurality of second-conductivity-type regions, each of the second-conductivity-type high-concentration regions having an impurity concentration higher than an impurity concentration of each of the second-conductivity-type regions;
a plurality of recesses provided in the semiconductor substrate at the first main surface of the semiconductor substrate, respectively exposing, each at a bottom thereof, the plurality of the second-conductivity-type high-concentration regions;
a first electrode including a titanium film and a metal film containing aluminum that are sequentially stacked on the first main surface of the semiconductor substrate, the titanium film being in contact with the first-conductivity-type region and forming Schottky junctions with the first-conductivity-type region, the titanium film being in contact with the second-conductivity-type high-concentration regions respectively at the bottoms of the recesses to thereby form an ohmic contact with each of the second-conductivity-type high-concentration regions; and
a second electrode provided on the second main surface of the semiconductor substrate, wherein
each of the second-conductivity-type high-concentration regions has an impurity concentration distribution in which the impurity concentration thereof is at a peak concentration at the bottom of the recess exposing said each second-conductivity-type high-concentration region, and decreases gradually therefrom in a depth direction.

9. The silicon carbide semiconductor device according to claim 8, wherein
an impurity of the second-conductivity-type high-concentration regions is aluminum.

10. The silicon carbide semiconductor device according to claim 8, wherein
a width of each of the second-conductivity-type high-concentration regions is equal to a width of each of the second-conductivity-type regions.

11. The silicon carbide semiconductor device according to claim 8, wherein
the impurity concentration of each of the second-conductivity-type regions is in a range from $1\times10^{18}/cm^3$ to $2\times1^{19}/cm^3$, and
the impurity concentration of each of the second-conductivity-type high-concentration regions is at least $3\times10^{20}/cm^3$.

12. The silicon carbide semiconductor device according to claim 8, wherein
the silicon carbide semiconductor device is free of silicide between the first electrode and the semiconductor substrate and inside the first electrode.

13. The silicon carbide semiconductor device according to claim 8, wherein
each of the second-conductivity-type high-concentration regions has a portion thereof bonded to the titanium film, said portion having a bonded surface area,
the bonded surface area of one of the portions directly beneath a connection portion for connecting the first electrode to a wire is larger than the bonded surface area of any of the other portions, and between any two of the portions, the one further from the connection portion has a smaller bonded surface area.

\* \* \* \* \*